United States Patent
Karr et al.

(10) Patent No.: US 9,092,678 B2
(45) Date of Patent: Jul. 28, 2015

(54) SYSTEMS AND METHODS TO LOCATE AN OBJECT

(71) Applicants: Lawrence J. Karr, Santa Monica, CA (US); Jonathan Coon, Austin, TX (US)

(72) Inventors: Lawrence J. Karr, Santa Monica, CA (US); Jonathan Coon, Austin, TX (US)

( * ) Notice: Subject to any disclaimer, the term of this patent is extended or adjusted under 35 U.S.C. 154(b) by 0 days.

(21) Appl. No.: 13/844,707

(22) Filed: Mar. 15, 2013

(65) Prior Publication Data
US 2014/0035732 A1      Feb. 6, 2014

Related U.S. Application Data

(60) Provisional application No. 61/678,002, filed on Jul. 31, 2012.

(51) Int. Cl.
| | |
|---|---|
| G06K 7/10 | (2006.01) |
| G06K 19/07 | (2006.01) |
| H03J 7/02 | (2006.01) |
| G06K 17/00 | (2006.01) |
| H01Q 7/00 | (2006.01) |

(52) U.S. Cl.
CPC ........ G06K 7/10148 (2013.01); G06K 7/10069 (2013.01); G06K 19/0726 (2013.01); H03J 7/02 (2013.01); G06K 2017/0045 (2013.01); H01Q 7/005 (2013.01)

(58) Field of Classification Search
CPC ............... G06K 19/0726; G06K 2017/0045; G06K 7/10069; H01Q 7/005; H03J 7/02
USPC ............. 340/10.4, 10.5, 13.2, 13.24, 13.27, 340/539.13, 825.03; 455/62, 63.3, 71
See application file for complete search history.

(56) References Cited

U.S. PATENT DOCUMENTS

| | | | |
|---|---|---|---|
| 7,482,926 B2* | 1/2009 | Pillai | 340/572.1 |
| 7,646,330 B2 | 1/2010 | Karr | |
| 8,294,554 B2* | 10/2012 | Shoarinejad et al. | 340/10.1 |
| 2004/0108954 A1 | 6/2004 | Richley et al. | |
| 2005/0116823 A1 | 6/2005 | Paulsen et al. | |
| 2005/0201450 A1* | 9/2005 | Volpi et al. | 375/150 |
| 2006/0022801 A1* | 2/2006 | Husak et al. | 340/10.5 |
| 2007/0073513 A1 | 3/2007 | Posamentier | |
| 2008/0036594 A1* | 2/2008 | Kates | 340/541 |
| 2008/0042845 A1 | 2/2008 | Richards et al. | |
| 2009/0273465 A1 | 11/2009 | Shamir et al. | |

OTHER PUBLICATIONS

IEEE Computer Society; 802.15.4a; IEEE Standard for Information technology—Telecommunications and information exchange between systems—Local and metropolitan area networks-Specific requirements. Part 15.4: Wireless Medium Access Control (MAC) and Physical Layer (PHY) Specifications for Low-Rate Wireless Personal Area Networks (WPANs). Amendment 1: Add Alternate PHYs; 2007; pp. 1-203.
PCT International Search Report for PCT International Patent Application No. PCT/US2013/053052, mailed Nov. 26, 2013.

* cited by examiner

*Primary Examiner* — Daniell L Negron
*Assistant Examiner* — Benyam Haile
(74) *Attorney, Agent, or Firm* — Holland & Hart LLP

(57) ABSTRACT

A computer implemented method to locate an object is described. A first transmission is obtained from a transmitter. The first transmission received at a first receiver. Tuning instructions are determined for a second receiver based at least in part on frequency information of the first transmission. The second is instructed to tune into a second transmission from the transmitter according to the tuning instructions. Arrival information for the arrival of the second transmission is obtained at each of the first receiver and the second receiver. A location of the transmitter is determined based on the arrival information.

19 Claims, 25 Drawing Sheets

SYSTEMS AND METHODS TO LOCATE AN OBJECT

BACKGROUND

In various situations, it may be desirable to know the location of an object. For example, it may be desirable to be able to locate a misplaced set of keys. In another example, it may be desirable for a user to be able to locate themselves in an unfamiliar and/or busy environment.

Locations systems often use a configuration of one or more transmitters and or one or more receivers to determine location. In many cases, the ability to locate an object depends on the proximity of the one or more transmitters and the one or more receivers.

SUMMARY

A computer-implemented method to locate an object is described. A first transmission is obtained from a transmitter. The first transmission received at a first receiver. Instructions (e.g., tuning instructions, timing instructions, and/or data content information) are determined for a second receiver based at least in part on frequency information of the first transmission. The second is instructed to tune into a second transmission from the transmitter according to the tuning instructions. Arrival information for the arrival of the second transmission is obtained at each of the first receiver and the second receiver. A location of the transmitter is determined based on the arrival information.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
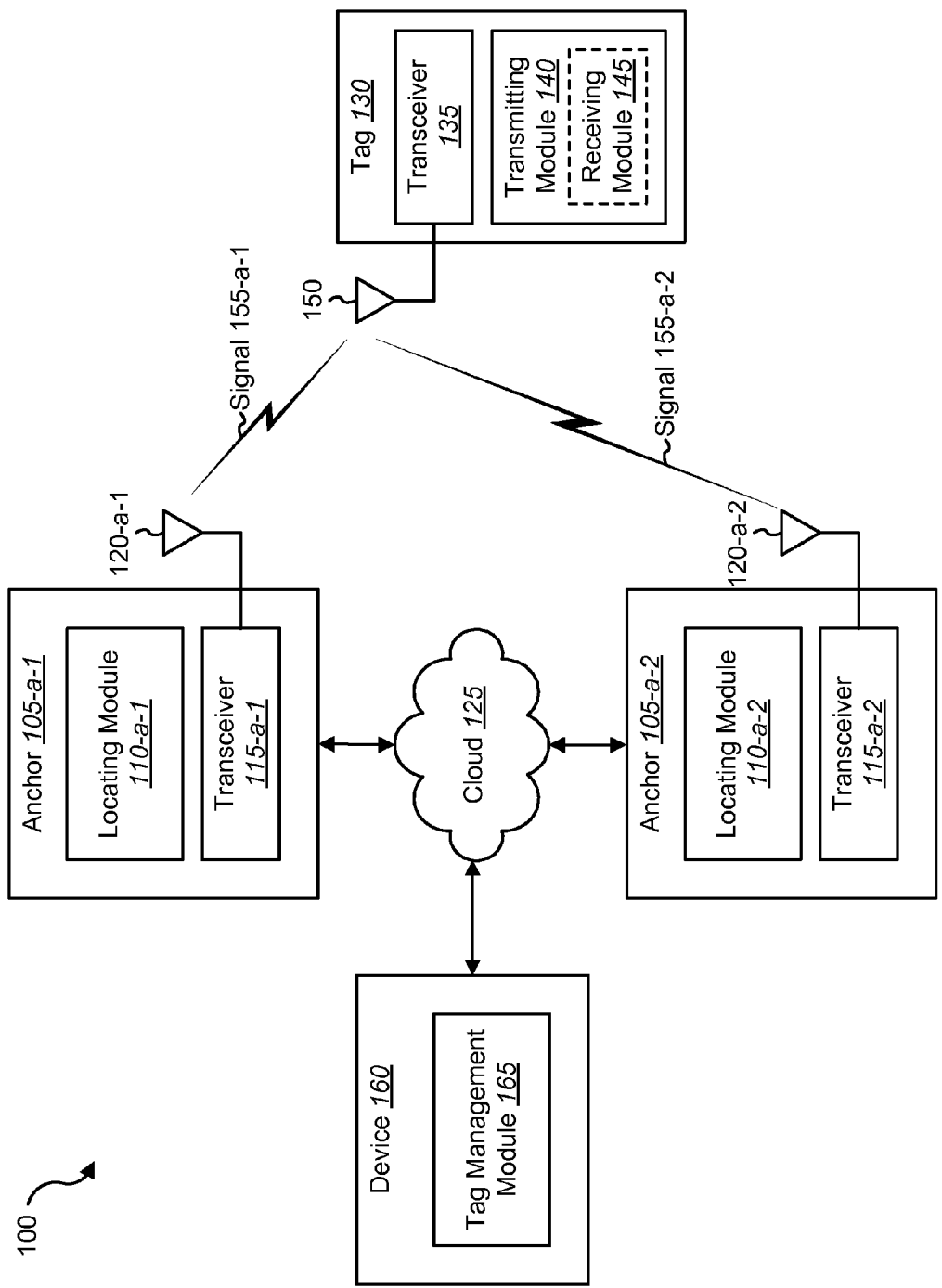
FIG. 1 is a block diagram illustrating one embodiment of an environment in which the present systems and methods may be implemented.

While the embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

In one example, the systems and methods described herein may be used to locating an object. For example, the systems and methods described herein may be used to locate an object using Time Difference of Arrival (TDOA) and/or Time of Arrival (TOA).

In some cases, Ultra-Wide Band (UWB) radio technologies may be used for TDOA and/or TOA location systems. By definition, UWB systems operate over a wide band of frequencies (a large portion of the radio spectrum, >500 MHz, for example). However, because UWB systems operate over a wide band of frequencies, UWB signals may interfere with other signals (e.g., that operate within the same band of frequencies). To prevent UWB systems from interfering with narrow band carriers, stringent limits are generally placed on radiated power. For example, in the United States, UWB transmitters may be legally limited to a radiated power level of −11 dBm. Unfortunately, limiting the radiated power of UWB signals may reduce the range of UWB signals. As a result, the number of anchors that may receive the UWB signal may also be reduced.

In some cases, the range of UWB signals may also be limited because of signal attenuation issues. For example, the microwave frequencies used for UWB systems (6.5 gigahertz, for example) may suffer from high free space attenuation, which may curtail the communication range. In some cases, the range of UWB signals may additionally be limited because of signal loss issues. For example, microwaves may be absorbed and/or reflected by common materials, which reduces signal range (particularly in indoor environments, for example). It may be noted that the Friis transmission equation may be used to model free space power loss.

The institute of Electrical and Electronics Engineers (IEEE) 802.15.4a UWB standard specifies preamble symbols that have a duration of one microsecond. At maximum power radiation of −11 dbm or 80 microwatts, the resulting maximum radiated energy of the preamble may be 80 microwatts times 1 microsecond or 80 picojoules. Therefore, assuming no signal attenuation or signal loss, the maximum amount of energy that may be received at an anchor may be 80 picojoules. It may be noted, that 80 picojoules minus free space attenuation and absorption may not be a lot of energy, especially considering the energy of the received noise.

Because the energy content of UWB signals (e.g., 80 picojoules) is generally spread over a wide band of frequencies (e.g., >500 MHz), the resulting signal may have low spectral density (making it harder to detect from the noise floor, for example). It may be noted, that the low spectral densities of UWB signals allow the UWB signals to use overlapping frequencies as narrowband systems without interference (because the low spectral density makes the UWB signals too weak to interfere, for example). However, range may be based at least in part on the amount of energy that may be received at the receiving antenna (relative to the noise, for example). As a result, each of these factors may reduce the ability of an anchor to receive a transmitted signal.

In TDOA, the location of a transmitter (e.g., tag) may be determined based at least in part on the difference in arrival time of a transmitted signal at each receiver (e.g., anchor). For example, the location of the transmitter may be determined based on the known location of each anchor and the time of arrival of the transmitted signal at each anchor. In TDOA location systems, the specificity of the location may depend on the number of anchors that are able to provide time of arrival information. For example, arrival information from two anchors may limit the location of the tag to a surface (a hyperboloid, for example), while arrival information from three anchors may limit the location of the tag to a line (a curve, for example). Arrival information from four anchors may limit the location of the tag to a single point in a three dimensional space (typically the desired case, for example). Therefore, increasing the number of anchors that provide time of arrival information may be beneficial. In some cases, the number of anchors that provide time of arrival information may be increased by extending the range at which each anchor may detect a transmitted signal. In some configurations, the systems and methods described herein may allow more anchors to provide time of arrival information.

In TOA, the location of the transmitter may be determined based at least in part on the round trip time (RTT) between the transmitter and at least one receiver. In some cases, the round trip time between one receiver may be used to determine single trip times for each receiver that obtained arrival time information (when each of the receivers are synchronized, for example). To obtain round trip time, two-way ranging may be required. In some cases, the precision that is provided by TOA allows for more precise location determinations using fewer anchors (than may be required for TDOA). Some of the advantages of using TOA may be that TOA may use fewer anchors and may be less affected by geometric dilution of precision (as compared to TDOA).

Regardless of whether TDOA and/or TOA is/are being used, the anchors may perform correlation for preamble and/or signal detection. UWB receivers operating according to 802.15.4a and similar protocols may depend on preamble detection. Unfortunately, preamble detection may be the most computationally demanding portion of a low-speed UWB receiver's signal processing. Generally, this computation may be necessary because the receiver may have no a priori information about timing, frequency, or presence of an UWB signal. As noted above, the limited transmit energy and sparseness of UWB signals may further complicate the reception process.

Typical preamble patterns used in UWB receivers may be composed of 31 ternary level chips each spaced apart by 31 intervening silent chips. The preamble patterns may therefore be 31*32 or 992 chips long. While sliding correlators (which may operate in 992 positions, for example) or a parallel set of sliding correlators may be used, sliding correlators generally tend to be slow. While it may be possible to coarsen the search and correlate against 31 possible locations (which is much faster), this approach may be noisy. Fast Fourier Transform (FFT) circular correlation, may be workable, but generally requires awkward length FFTs, or resampling to achieve convenient lengths. For long patterns, FFT correlation may be the preferred correlation, especially when those patterns are more populated.

Given the regular and sparse nature of the usual UWB pulses, it may be logical to break the correlation into "slices." In one example, instead of a 992 point by 992 alignments correlation, a 32 slice by 31 point by 31 alignments correlation may be used. In these cases, it may be convenient to perform the correlation in a "slice processor." In one example, generating the full correlation output may be avoided (sparing memory) by recording (e.g., only) the maximum values and their locations in each "slice." The next biggest value in the slice may be irrelevant because it is at least 32 samples distant and is therefore irrelevant to initial peak detection/location.

In one example, a slice processor may include 31 complex accumulators, with controllable +−0 and clear operations. As each complex value bears on the slice processor, the 31 possible correlation results may be generated as the partial sum/differences of the 31 input values. The control of this process may be represented as a simple rotation of the preamble itself, containing 31 3 level commands. To recap, each slice processor may accept a complex value as its input each clock, and may update 31 complex correlation sums as functions of that input complex value. The gating logic for +−0 accumulation may be the ternary value set by the preamble itself. In some cases, the controlling preamble may be circularly shifted each time a new complex sample is accessed. In some embodiments, all frequency bins may be read simultaneously, and all correlation slices may be updated at that time.

In some cases, a receiver may integrate many copies of a repeating preamble symbols to achieve increased sensitivity. One of the challenges with this approach may be that the frequency offset uncertainty between the transmitter and receiver will cause considerable degradation to the integration process, which, may otherwise be implemented as straight cyclic integration. If, for instance, a 12 part per million frequency difference exists between the transmitter and the receiver, then, at 6.5 GHz, a carrier frequency difference of 78 KHz may result. At 78 KHz, the capture of 8 symbols by coherent cyclic integration, spanning 8 microseconds roughly, may be degraded by about 6 db from sin x/x effects. A null typically arrives at a 125 KHz offset.

In some cases, a high sensitivity receiver may use accumulation of preamble symbols, probably 64 symbols, to achieve adequate sensitivity (at 110 kbit/second, for example). The preamble symbols may be collected in "supersymbols" of 4 symbols cyclically integrated, and grouped as 16 supersymbols comprising 64 collected symbol times, or commonly about 64 microseconds. In one example, these supersymbols may be rotated and summed into Doppler bins by repeated (992 times) use of a 16 point complex FFT. All of this may enable a receiver to achieve maximum sensitivity/range in conventional UWB reception. For example, these approaches may allow low energy, sparse UWB signals to be detected (rise out of the noise floor, for example).

In some cases, the supersymbol integration, with nominally 4 symbols cyclically integrated, may itself suffer from sin x/x effects, but at doubled frequency offset. The first null may be experienced at 250 KHz offset, which is about 40 ppm. As a result, it may be prudent to design the system so that no more than +−20 ppm of offset exists between receivers and transmitters. If this is unreasonable, then the supersymbols may be reduced in length (to 3 preamble symbols, for example).

In some cases, a message symbol, with 128 active chips, bearing 1 bit of information plus coding, may be decoded adequately at an Eb/No of about 6 db. Since preamble symbols may have one-eighth the energy, and may require about 12 db S/N for reliable detection, there may be an increase of about 32 times to achieve parity, and 64 times for negligible degradation.

The Doppler rotation process may generate a set of frequency offset integrated preamble symbols. In one example, if the spin processes 16 FFT using 8 component 4 point single clock FFTs, then it can bear pipelined results every clock. In another example, if a simpler 16 FFT is used, which may have only 2 constituent 4 point FFTs, then a result may be generated every 4 clocks.

Since there may be 16 frequency bins, if the correlation slice process is to match the speed of the faster FFT spin process, there may need to be 16 correlation slices. In some cases, where spin sets are available every four clocks, and there may be four slice processors. This arrangement at 100 MHz may perform the FFT spin and signal correlation in a total time of 40 microseconds. It may be noted that the stored selected peak values may comprise all relevant data regarding signal detection, frequency, phase and close-in peak shape. In some cases, the system with four slice processors, each processing 4 slices in sequence, may require that the slice processors each have four sets of accumulators.

As noted above, UWB signal reception may present a number of challenges. In general, transmitting ultra wideband (UWB) signals uses far less energy than receiving UWB signals, especially when reception is coherent (long range capable). There may be many reasons why coherent receivers may use more energy. One reason why coherent receivers may use more energy may be because coherent receivers generally require accurate frequency information, or must generate such information in the act of receiving. To generate the information during reception may be a sizeable computational task (not well suited to tiny tags and their tiny batteries, for example). Some of the most efficient algorithms have computation needs that asymptotically increase with the integration interval. Given frequency uncertainty, the integration interval may increase as the number of frequency bins increases. Another reason coherent receivers use more energy may be because most reception involve long-term monitoring. Another reason coherent receivers may use more energy may be because coherent receivers typically need to manipulate the signal in frequency space, and employ sophisticated techniques such as Rake processing to recover the data.

However, for TOA the tags may need to both transmit and receive signals. As noted above, receiving may not be an option when power use is a concern (when operating on battery power, for example). As a result, a low power receive may be needed for TOA (when power constraint is an issue, when operating on a battery, for example).

The systems and methods described herein may overcome all of the above noted challenges. In some configurations, the systems and methods may allow tags to use very little energy while operating as long range coherent transceivers.

In one example, tag A may emit a signal, which may be received by at least one anchor (as in TDOA, for example). In some cases, this signal may indicate by its data contents, or by its timing relative to previous tag A transmissions that tag A will receive responses (e.g., "is open for business", will listen). In one example, a single anchor B, selected by the cloud system or by an anchor based on results received from other anchors via the cloud (likely the anchor that best received the signal from tag A, for example), replies to tag A after a mutually known delay. This time delay may be relatively short (to reduce the likelihood of frequency drift, for example). When anchor B replies to tag A, it may do so at the exact frequency and cadence used by tag A, unless another arrangement is made for transmission at a different precise frequency. Transmitting the reply at the exact frequency and cadence used by tag A (or the different precise frequency, for example) may allow tag A to cyclically integrate the signal coming from anchor B, without any concern for frequency offset. In this way, tag A may receive the signal from anchor B, without expending even the energy used by the short capture digital processing. As a result, tag A may coherently receive a lengthy "virtual interrogation signal" which was really a response to its query. In one example, Tag A may now reply to anchor B (and all other anchors), again at its nominal frequency. As a result, there may be long integration at both ends of a process, without heavy digital processing (two-way ranging at a fraction of the energy cost, for example).

In one example, the frequency adjustment of both the carrier frequency and the sample rate may be implemented using a fractional-N synthesizer.

In some cases, the fractional-N synthesizer (e.g., an on-chip fractional-N synthesizer) may produce the small frequency shifts accurately and predictably. In one example, the chip/sample rates may be derived from a common high frequency clock. The selected anchor may adjust its frequency without making any demands of the tag's frequency control system. In the case, that the arrangement is to use a different specified frequency (a particular offset from the received frequency, for example), then both the tag and the anchor may operate in a frequency adjusting mode.

In a most basic mode, the tag may expect a reply at its frequency. When such a reply is received, the tag may cyclically integrate the preamble symbols as a set (using 992 complex integrators, for example). In one example, the correlation may be applied (as a one-time process, for example) after the completion of the integration. In some cases, applying the correlation after the completion of the integration may reduce the correlation processing by a factor of as much as 1000. The tag's power may be kept continuously on, to maintain phase and frequency continuity during the receive and the ensuing transmission.

If a tag's signal can be received and demodulated by at least a single anchor, then the anchor (and/or the cloud based system, for example) may coherently locate that tag despite large distances and intervening objects. The improved position accuracy resulting from two-way ranging may be very beneficial.

Tags may transmit on a metronomic basis. If a transmission typically lasts 2.7 milliseconds, and the transmitter consumes 8 milliamperes, and a previous start-up period also spans 2.7 milliseconds, consuming 3 milliamperes, then the charge from each transmission may be about 30 microcouloumbs. If these transmissions occurred every 30 seconds, this may be a 1 microampere average drain.

As noted previously, UWB receivers may use much more power than low power UWB transmitters (perhaps 8 times as much, for example). Given the high power consumption of the UWB receive, if a tag were to receive often, a battery may rapidly be exhausted. For example, a receiver operating for 3 milliseconds may consume 64*3=192 microcoulombs per operation.

As discussed above, tags may periodically signal their intent to listen after their transmissions, so that a chosen anchor can interrogate said tag. In some cases, the tags may listen based on a mutually known schedule. For instance, the tag may listen after each transmission (e.g., epoch transmission). Upon receiving a reply (e.g., an interrogation), the tag may reply to this interrogation with a precisely timed tag transmission, establishing a two-way path from the selected anchor to the tag back to the selected anchor. In some cases, the distance measured by and available from the selected anchor (the RTT, or trip time, for example) may be used to convert additional anchors' time measurements (arrival times, for example) to TOA reckoning. In some cases, this may significantly reduce any geometric dilution of precision (GDOP).

It may be noted that the selected anchor may have an excellent unobstructed path from the tag (as determined based on previous observations, for example). As a result, the chosen tag to anchor path may have low loss. Under these conditions, the anchor to tag path, being the same by reciprocity, may have an identically low loss. In most cases (barring those with strong noise sources near the tag), the tag may observe a good signal to noise ratio. Accordingly, a loss in performance resulting from the use of a higher speed transmission mode may be inconsequential.

Under these conditions, it may be possible to use the slightly less robust but much higher speed 850 kilobit/second transmission mode when transmitting the UWB signal to the tag. In these cases, the chosen anchor may transmit at about 4 times the usual power level for about 250 microseconds, (which realizes the same average RF power over a 1 millisecond averaging time, for example). In one example, the 64 length preamble may be used in these cases. As a result, the tag's receiver that is collecting this message may only need to be active for about 300 microseconds, consuming 0.3*64 or 19 microcoulombs. Given this 10×+ reduction in charge, the receiver may be used without severe impact on battery life.

When the tag replies to the selected anchor, the tag may use a long preamble and/or a low speed data mode, so that distant anchors may successfully integrate the tag signal. In one example, this "triple path" process might run every few minutes, depending on conditions and requirements.

As described previously, the more anchors that are able to provide arrival timing information, the more precise the location may be determined. Thus, systems and methods for increasing the amount of energy that can be received at the receiver (for extended range) may be desirable.

In one example, a UWB TDOA and/or TOA location system may include one or more "tags" and two or more "anchors." In some cases, the tag may include a small transmitter (e.g., transponder) that emits an identifying signal according to one or more predetermined schedules. In other cases, the tag may include a transceiver for transmitting (as described) and receiving signals from one or more anchors. Each anchor may include a receiver or a transceiver for receiving transmitted signals from a tag and/or transmitting signals to a tag. In one example (as described previously, for example), the tag may be located based on the known location of each anchor and based on the TDOA of the signal relative to each detecting anchor and/or based on the TOA of the signal using two-way ranging.

One of the known solutions for extending range in a UWB TDOA system requires precise frequency control. As indicated previously, the IEEE 802.15.4a UWB standard specifies that preamble symbols have a duration of one microsecond. At 6.5 GHz, a typical UWB frequency, coherent processing for 1 millisecond (integrating 1000 symbols coherently) may require that the receiving and transmitting frequencies differ by less than 0.15 parts per million (ppm). At a receiver to transmitter frequency difference of 1/(1 msec*6.5 GHz)=0.154 ppm, the received sequence may be received at all phase angles equally, nullifying correlation. To achieve a loss of no more than 1 db from coherent processing, the maximum mutual frequency error in this case may be less than 0.04 ppm.

Unfortunately, this level of frequency precision may be impractical with inexpensive crystals or oscillators (the type that may be used in tags, for example). Therefore, coherent reception may be limited to times and frequencies compatible within reasonable commercial tolerances. A frequency difference of +−20 ppm may be a reasonable limit for a pair of inexpensive crystals, and with a TDOA system operating at 6.5 GHz, the preferred frequency in much of the world, a 1 microsecond single symbol coherent capture in 802.15.4a may be attainable. In some cases, a correlation period of seven microseconds may yield a null at about +−20 ppm. A 1 db loss (good performance) may correspond to a coherent integration period of two microseconds or two preamble symbols. To extend this period to one millisecond, the mutual frequency tolerance may need to be tightened by a factor of 500. The performance to be gained from one millisecond coherent integration compared to two microsecond coherent integration may be considerable (log 2(500)=27 db, for example). In some cases, an incoherent averaging scheme may be used to reduce this disadvantage to about 15 db. It may be noted that 15 db is a free space range ratio of roughly 5 times, and that 27 db is a free space range ratio of about 20 times. Therefore, it may be a difficult problem in a one-way low power system (when the tag is transmitting without listening (e.g., only transmitting), for example) to achieve such frequency accuracy, especially since tag batteries may be tiny, making repeated trial transmissions at differing frequencies infeasible.

In some configurations, the systems and methods described herein may overcome the present obstacles by utilizing a cloud based anchor system (e.g., connected through a network, Internet connected, for example). In a cloud-based system, a computing device (e.g., an anchor, server, etc.) may know the location and the frequencies of each anchor device. For example, since the anchor devices are at least indirectly internet connected and may be continuously powered, their actual frequencies may be determined with the use of an internet timeserver (NTS). In some cases, anchors having long counters may periodically report those counter values, which may be time stamped.

In general, network time protocol routinely achieves 10-millisecond latency variation or less. This means that in one hour, the frequency of an anchor's clock may be measured to 1 part in 360,000. In 24 hours, this average frequency may be known to about 100 parts per billion (ppb). Thus, a computing device may know, in one day, the frequencies of all anchors to within 100 ppb. The cloud connected computing device may additionally measure the frequency versus temperature characteristic of each anchor by requesting temperature readings from each anchor, and correlating the temperature characteristics with time/frequency. In some cases, the cloud connected computing device may accurately predict the frequency of each anchor to within 50 ppb at any time. In this way, each anchor may be given frequency information so that they can coherently communicate with each other.

In some cases, anchors may (initially, for example) use a protocol with repetitive signals to form an ad hoc network. In some configurations, anchors may not need to conserve power, so this kind of discovery process may be acceptable.

Returning to the issue of range, the IEEE 802.15.4a standard specifies lengthy preambles, but much terser data bearing signals. Consequently, the preamble may be coherently detected at great range, but the emitter (e.g., the tag) might not be identified, since the data could not be reliably recovered at distance.

In some configurations, the systems and methods described herein may remedy this issue. In one example, if any nearby anchor is able, with short period correlation, to receive the complete signal including tag identification from a tag, then that anchor may have the tag's identity. Additionally, the frequency-tracking loop in the anchor may be used to determine the tag's exact frequency offset with respect to that anchor, the exact cadence of the tag's signaling, etc. This information may be forwarded to the other anchors via the cloud. When this information is forwarded to the cloud, each of the other anchors are given foreknowledge of the tag's next transmission timing (accurate quartz tag timer required, for example), the anchor may command other nearby anchors to receive at precisely specified frequency offsets with respect to their respective frequencies, and at precise times. Then each anchor may receive the tag's signal with long coherent integration (as described above). In some cases, this may enhance free space range (by as much as 20 times, for example). As a result, it may be likely that enough anchors will successfully receive the signal to make location possible, whereas previously only one anchor may have received the signal. It may be noted that the exact timing and the exact signal frequency of the tag may serve to identify the tag even lacking its data field (the tag may be identified based on the signal being detected at the foretold precise frequency and at the foretold precise time, for example). As a result, the cloud's information flow may convert the single-anchor reception of a tag into a successful location event for multiple anchors the next time that the tag transmits.

In one example, if a tag transmits every 30 seconds, and transmissions span 2 milliseconds, then the chance that any single randomly selected tag has interfering timing may be less than (6 msec/30 seconds), or 1 in 5000. With the addition of precision anchor frequency control, and with near orthogonality between tag signals given long integration, the probability of a jamming collision may be further reduced.

It may be noted that successful three-dimensional location using TDOA requires at least four anchors to receive the tag signal. Therefore, an increase in range may bring more anchors into play, thus increasing the probability of successfully locating the tag.

In some configurations, the systems and methods described herein may allow long distance TDOA and/or TOA positioning with UWB signals to be feasible. It may be noted that the more distant anchors, or at least those receiving a more attenuated signal, may still not be able to receive the coded data including the tag identity, since longer coherence is of no value when the individual signals are of relatively short duration. However, it may be possible to receive an entire tag identity as a single correlation pattern, given preknowledge. In some configurations, the cloud based anchor system may also do this. This may be useful at great distance, where the one microsecond length of a repeating preamble or other symbols gives range ambiguity. In some cases, correlating on the frame denoting the end of the preamble (e.g., the start frame delimiter (SFD)) plus the other expected data may resolve any ambiguity (e.g., correlating over the entire message, preamble and data). It may be noted, that correlation may be performed over a part of or the entire message even though demodulation of any part of the sequence may be impossible, as the individual message pieces may lie on the "communication impossible" side of the Shannon limit. For instance, the individual code pieces themselves may be used as "chips" in an "expanded spread spectrum system." In some configurations, since the frequency offset may be well known, the correlation problem may be reduced. For instance, an SFD sequence plus one hundred data bits at the 110 Kbit/second data rate might span one millisecond. Although, this signal may require a long correlator, it may only require one frequency bin. In some cases, this may be reduced then to a single lengthy correlation problem.

In some configurations, as range is extended, the period of the basic preamble sequences may become a problem. It may be noted that one microsecond at the speed of light may be about 1000 feet. In some configurations, ambiguity may result if path differences approach this 1000 feet mark (or its equivalent based on the sequence time, for example). Various methods may be used to resolve this type of ambiguity (see U.S. Pat. No. 7,646,330 to Karr, for example).

In some configurations, it may be useful to divide a long preamble into two or more parts, where the second part has a small frequency shift. This frequency shift may be such that an integer fraction like ½, ⅓, or ¼ of a turn is rotated per preamble symbol. In this way (in the one quarter turn per symbol rotation rate case, for example), 4 modular times of arrival may be distinguished between, extending the ambiguity interval to 4 microseconds, or about 4000 feet. In some cases, this spun or step-rotated signal may be detected with sensitivity matching that of regular preamble detection. In some configurations, each anchor in the locale may phase align local copies of this spinning signal themselves to facilitate this process.

In some configurations, the timer (e.g., quartz watch timer) in the tag, which may be calibrated against the more stable high frequency clock oscillator, may be needed to ensure predictable transmission times, and for other purposes. For example, one purpose may be to update the tag ID at suitable, predictable intervals, so that tags cannot be tracked by unauthorized persons. In some cases, this may achieved by encrypting the tag ID code.

In some configurations, it may be useful to place sensing devices in these tags, so that tags can respond to changes in light, temperature, and/or acceleration. For example, under certain circumstances, the tag may shorten its time between transmissions (to allow for more frequent location updates, for example) or increase its listening schedule to receive instructions from an anchor. In on example, a tag may detect that it is being stolen based on environmental changes (e.g., motion, location, lighting, temperature, etc.). In some cases, these tags may even function as ad hoc warning sensors. For example, warning messages or other information may be transmitted to the anchors regarding the event. For instance, if temperatures are rapidly increasing in the bedroom, then the tag may indicate that there may be a fire in the bedroom.

In some embodiments, a cloud based UWB TDOA, TOA location systems may use electronically steered antennas on anchors, so that even relatively distant anchors may "point" their antennas in the correct general direction of a tag, to increase the probability of successful detection. In these cases, a computing device (e.g., an anchor, a server, etc.) in the cloud may message the appropriate anchors with antenna direction commands.

In one example, anchors, in their default mode (no other assigned tasks) may listen for tag-generated preamble signals, and for the data bursts arriving after the preambles. In some cases, distinct preamble codes may be used for anchors and for tags.

As described above, the anchors may be able, without a priori information, to coherently process 64 preamble symbols, achieving a 64× gain over devices, which coherently process a single preamble symbol. In some cases, this enhanced performance may achieve over a +−20 ppm frequency tolerance, so that inexpensive, practical tags may be reliably detected.

If an anchor is able to detect a preamble and the associated low speed (110 kilobits/second) data following, it may report this information to a computing device (e.g., an anchor, a server, etc.) via the cloud (via WiFi signaling, for example). The receiving anchor and/or the computing device may determine the tag's identity (based at least in part on its encrypted serial number, for example). If the computing device obtains reports of the tags presence from other (e.g., several) anchors, then an approximate (TDOA) location may be obtained (based on the known location of the anchors and the known timing (relative or synchronized) of the receiving anchors).

In one example, the anchor reporting the highest quality signal from the tag may be selected as the "synchronizing anchor." In some cases, the synchronizing anchor may transmit a reply message to the tag, very shortly after the completion of the tags transmission (to reduce the potential for frequency drift, for example). The synchronizing anchor and other nearby anchors may be given the exact frequency, cadence, and/or timing of the tag in relative terms, sent in encrypted messages from the computing device (via the cloud, for example). Those anchors, which may or may not be in a single system, may additionally be told, to an accuracy of a few microseconds, when the tag is going to transmit. The anchors may also be told, to an accuracy of a few microseconds, when the tag is going to receive.

As noted previously, coherent reception of UWB signals consumes several times more energy than the corresponding transmission process. As a result, when the synchronizing anchor transmits to the tag, it does so at 850 kilobits/second, shortening the message by a factor of about eight. This in turn may reduce the tag receivers on-time/energy-consumption by a factor of eight. Since the Federal Communications Commission (FCC) regulations measure UWB average power over a 1 millisecond interval, this brevity may allow the synchronizing anchors transmit power to be legally increased by a factor of about 3, leaving the total message energy reduced a factor of ⅜ or so. The tags battery may be able to supply power to its receiver for this reduced time (about 300 microseconds). Since, by selection (as defined by the selection criteria), the anchor with the best path is transmitting to the tag, this reduction in received energy should not be a significant problem (because it has the best path, for example). In some cases, the tag operations may occur in very close time order. In these cases, the pre-selected synchronizing anchor and assisting anchors have more precise frequency and time information, since the tags frequency has not changed. The tags high frequency oscillator may be operating continuously through transmit, receive, (conditional transmit). In these cases, the tag's energy consumption may be reduced since there may be only a single oscillator to start up. Additionally, the tags reception process may be simplified, which further reduces energy consumption.

Continuing with the above example, the tag may receive and processes the 850 kilobit/second transmission, which may include one or more control messages. The tag may then reply with a 110 kilobit/second transmission, which may be coherently received as a whole (as described above), rather than as data, by the selected anchors. In some cases, this may enable two-way ranging with all of the anchors, enabling excellent (TOA) accuracy. The round-trip time with respect to the synchronizing anchor may be reported to the computing device, which may use that information, and the dog-leg path information to produce an accurate TOA-based position estimate. In some cases, the anchors (at some earlier or later time, for example) may exchange signals to measure inter-anchor distances and relative clock rates.

With this scheme, a tag may transmit once per epoch, unless it detects an appropriate reply (one that requests an additional transmit (e.g., for two-way ranging), for example), in which case it will send once more. If the epoch interval is about 1 minute, and the tag transmits once for 3 milliseconds, receives once for 300 microseconds, and may transmit again for 3 milliseconds, a transmit duty cycle of 0.003 in 60, or 50 in 1 million may result. The receive duty cycle may be 5 in 1 million, and the optional transmit duty cycle may measure UWB average power over a 1 millisecond interval (resulting in 50 in 1 million, for example).

If tag transmission uses 10 milliwatts, and tag reception uses 50 milliwatts, then the energy consumed may be 30 microjoules plus 15 microjoules, or 45 microjoules per minute, plus housekeeping energy, which might be another 15 microjoules. The computing device may control whether or not a reply request is sent to the tag. Once a tag is precisely located, it likely may not be important to repeat the process for some period. If the tag repeats its transmission one time in ten, this may add an average of 3 microjoules per epoch. Thus, a tag may be able to operate as a two-way location transceiver on about 1.1 microwatt average power. In one example, given that a 30 milliamp-hour lithium cell has energy content of 3600 seconds*3 volts*0.03 or about 300 joules, a tag (operating at this schedule, for example) may haves a projected battery life of about 270 million seconds, or about 8 years.

In one example, the initial tag transmission and the tag receiver operation might be separated by only a few hundred microseconds. Similarly, the tag might respond after reception with a delay of a few hundred microseconds. In some cases, tags may receive preambles by coherent on-frequency integration, and may receive data without frequency offset, achieving maximum performance with minimum energy consumption. It may be noted, that processing burdens and energy consumption may be shifted to the anchors as much as possible.

Many of the examples described herein utilize UWB radio technologies. However, it is understood that UWB radio technologies may be replaced with any of a variety of other radio technologies that may be suitable for extended range reception and/or TDOA location.

Referring now to the figures, FIG. 1 is a block diagram illustrating one embodiment of an environment 100 in which the present systems and methods may be implemented. In one example, multiple anchors 105 with known locations may be used to determine the location of a tag 130. For example, the location of the tag 110 may be determined based on the TDOA of a signal 155 received at the multiple anchors 105 and/or the TOA based on a two-way ranging procedure between one or more anchors 105 and the tag 130 (and the signal 155, for example).

In one embodiment, the tag 130 may include a transceiver 135, an antenna 150, a transmitting module 140, and receiving module 145. In one example, the transceiver 135 may transmit and/or receive a signal 155 via the antenna 150. In some cases, the signal 155 may identify the tag 130. For example, the signal 155 may include an encrypted identification code corresponding to the tag 130. In some configurations, the frequency of the transmitted signal 155 may be based on a crystal (e.g., oscillator) of the tag 130. It may be noted that the frequency of the crystal may be different from an expected frequency. For instance, inexpensive crystals (the kind that may be used for tags 130) may have a frequency within some reasonable tolerance of the stated crystal frequency. In some cases, the frequency of the crystal may vary due to environmental conditions (changes in temperature or humidity, for example).

In some configurations, the tag 130 may transmit the signal 155 (the same signal 155 or a different signal 155, for example) according to a schedule determined by the transmitting module 140. In one example, the transmitting module 140 may set a consistent schedule (transmitting every 30 seconds, for example). In another example, the transmitting module 140 may vary the schedule based on one more events (e.g., time of day, location, etc.). For example, the transmitting module 140 may indicate that a transmission be sent every 300 seconds during the night and every 60 seconds during the day. In one example, a schedule of transmissions every 60 seconds may allow for battery life in excess of two years. In some cases, the transmitting module 140 may provide different transmission schedules for different objects. For example, transmissions every 60 seconds may be frequent enough for a briefcase but not frequent enough for a smart phone or tablet (which may need transmission every 1 second, for example). In one example, the tag 130 may be instructed to use a particular schedule by a tag management module 165 (the tag management module 165 may be hosted on a device 160 that his accessible via the cloud 125, for example).

In some configurations, the transmitting module 140 may additionally include a receiving module 145. The receiving module 145 may listen (using the transceiver 135, for example) for incoming signals (e.g., signals 155). In one example, the receiving module 145 may listen for a short period at a predetermined time after an epoch transmission. As noted above, the receiving module 145 may receive a signal at a particular frequency and cadence (e.g., the particular frequency and cadence used by the tag 130 when transmitting the signal 155). In some cases, the tag 130 may only receive signals that have the particular frequency and cadence. During the listen (e.g., receive time), the receiving module 145 may receive one or more messages (from one or more of the anchors 105, for example). In one example, a received message may indicate whether the tag 130 should make an additional transmission (a transmission for two-way ranging, for example). In the case that an additional transmission is instructed to be made, the receiving module 140 may indicate the time of arrival that the received message was received at the receiving module 145. The transmitting module 140 may send the additional transmission at a predetermined time after the time of arrival of the received message (this may allow the predetermined time to be subtracted out in a RTT calculation, for example). In the case that an additional transmission is not requested, the transmitting module 140 may not transmit an additional message. For instance, the message received by the receiving module 145 may have been for control or other information that may not require two-way communication. In some cases, the receiving module 145 may allow for two-way communication between an anchor 105 and the tag 130.

In some cases, the tag 130 may include one or more sensors (not shown). For example, the tag 130 may include a light sensor, a motion sensor (e.g., piezo motion sensor), a temperature sensor, and/or acceleration sensor, etc. for determining one or more events. For instance, the tag 130 may include two sensors (which may allow for increased battery life and/or increased transmission scheduling when needed, for example). In one example, a user may want to locate a tag 130 (that has been set down, misplaced, lost, stolen, etc., for example). In this example, location updates (e.g., transmissions by the tag 130) every 60 seconds may be sufficient for finding the tag 130 (and the object that it is attached to, for example). In another example, a user may want to use a tag 130 to locate themselves and help them navigate in a (unknown, for example) space. In this example, the user may want location updates every second or every half-second (allowing for instantaneous updates, for example). For instance, the frequent location updates may allow a user to visualize their current location on a map of a trade show floor as they navigate their way through the trade show. In one example, updates every second or every half-second result in tag 130 transmissions occurring 60 or 120 times more often than the every 60 seconds example. In some cases, the receiving module 145 may receive instructions related to the transmission scheduling that may or should be used.

In one example, the sensors may be used to determine events where the transmit schedule of the transmitting module 140 should be updated. For example (in the case of a light sensor and a motion sensor, for instance), the transmit schedule of the transmitting module 140 may be updated based on the sensed conditions. In this example, the transmitting module 140 may transmit less often when the sensors detect that the environment is dark and not moving (in a stationary bag or pocket, for example), dark and moving (in a moving bag or pocket, for example), and light and not moving (sitting on a table, for example). In this example, the transmitting module 140 may transmit more often (every half second, for example) when the sensors detect that the environment is light and moving (the tag 130 is combined with a smart phone or tablet device that the user is looking at to determine their location in a space as they are navigating around, for example). In one example, a two-sensor approach may allow for a simple, low-cost solution. It is understood that more or less sensors may be used.

In some configurations, one or more sensors may be used to determine states of lost (based on no motion and/or darkness for a predetermined period of time, for example), stolen (based on predetermined motion characteristics, light/darkness scenarios, for example), and/or emergency (a fire based on a quick rise in temperature, earthquake based on motion characteristics, etc., for example).

In one example, the transmitting module 140 may vary the transmission schedule based on information from one or more sensors. For example, the scheduler 116 may transition from an every 60 seconds schedule to an every half-second schedule when a user is using the tag 130 to determine their location (the light and moving scenario, for example). In some cases, the transmitting module 140 may transition from a frequent transmission schedule to a less frequent transmission schedule when the tag 110 is sitting still and not exposed to light.

In one embodiment, each anchor 105 may have a known location. In some configurations, each anchor 105 may include a transceiver 115 and an antenna 120 for receiving a signal 155 from a tag 130 or for transmitting a signal 155 to a tag 130. In one embodiment, the antenna 120 may include multiple antennas 120 and may be configured for beam forming and/or directional reception. In some cases, each anchor 105 may be connected to the cloud 125 (e.g., network). Examples of the cloud 125 include the Internet, local area networks (LAN), wide area networks (WAN), personal area networks (PAN), etc. In some configurations, the cloud 125 may include one or more of satellite networks, cellular networks, wireless networks, fiber networks, etc. In some configurations, each anchor 105 may communicate with the device 160 (e.g., server, computing device, network appliance, tablet, phone, etc.) via the cloud 125. In some cases, anchors 105 may also communicate with other anchors 105 and/or other devices.

In some configurations, one or more of the anchors 105 may include a locating module 110. In some cases, the locating module 110 may determine the precise frequency and timing characteristics of a signal 155 from a first transmission of the signal 155 and may instruct one or more anchors 105 to tune into a second transmission of the signal 155 based on the determined precise frequency and timing characteristics of the signal 155. In some cases, the tuning in of the anchors 105 to the second transmission of the signal 155 may enable reception at extended ranges (allowing for TDOA and/or TOA location to be determined, for example). In one example, this may allow more anchors 105 to participate in the TDOA and/or TOA location system (resulting increased location precision, for example).

In one example, the tag 130 may transmit a signal 155 in a first transmission. For example, the transceiver 135 may transmit a signal 155 via the transmitting antenna 150. In some cases, the tag 130 may be closer to a first anchor 105-a-1 than to a second anchor 105-a-2. In one example, the proximity of the tag 130 to the first anchor 105-a-1 may result in the first signal 155-a-1 at the first receiving antenna 120-a-1 to be clearer than the second signal 155-a-2 at the second receiving antenna 120-a-2. In some cases, the second transceiver 115-a-2 may not realize that the second signal 155-a-2 was received by the second transceiver 115-a-2 (due to noise, for example). In some cases, the second transceiver 115-a-2 may not realize that the second signal 155-a-2 was received because the frequency of the signal 120 may be different from an expected frequency. As described previously, this difference may be caused by an inexpensive crystal and/or the operating environment of the crystal.

In some cases, the timing of signal 155 transmissions may be based on the transmitting module 140. In one example, the first transceiver 115-a-1 may accurately receive the first signal 155-a-1. In one embodiment, the first location detection module 104-a-1 may determine the precise frequency of the first signal 120-a-1, the timing for the next transmission, the symbol timing of the signal 155, and the content of the signal 155 (e.g., knowledge of the each transmitted symbol in the signal 155, for example). In some configurations, some or all of this information may be provided to each of the other anchors 105 (the second anchor 105-a-2, for example). For instance, the first locating module 110-a-1 may instruct (via the cloud 125, for example) a second anchor 105-a-2 to tune into a second transmission of the signal 155 at a particular time and at a particular frequency, cadence, etc. In some configurations, the second transceiver 115-a-2 may recognize the second transmission of the signal 155 based on the tuning instructions. In some cases, the first transceiver 115-a-1 may tune into the second transmission of the signal 155 based on tuning instructions tailored for the first transceiver 115-a-1. In one example, the first antenna 120-a-1 and the second antenna 120-a-2 may each receive the second transmission of the signal 155 at a particular arrival time. In some configurations, the first anchor 105-a-1 and the second anchor 105-a-2 may communicate their respective arrival information to the tag management module 165. In one example, the tag management module 165 may determine a location of the tag 130 based on the TDOA of a signal at the first and second anchors 105.

In another example, the first anchor 105-a-1 (e.g., a synchronizing anchor because of its best path) may transmit a message to the tag 130 during the tag's 130 listening (e.g., receiving window). The message may instruct the tag 130 to make an additional transmission (to establish two-way communication, for a two-way ranging request, for example). In one example, the locating module 110-a-1 may (effectively) start a first timer upon sending of the message to the tag 130. As described previously, the tag 130 may transmit an additional transmission (e.g., signal 155) at a predetermined time following reception of the message. The first locating module 110-a-1 may have instructed the second locating module 110-a-2 to listen in for the reception of the additional transmission. In some cases, the first anchor 105-a-1 and its locating module 110-a-1 may be synchronized (the clocks have been synchronized, for example) with the second anchor 105-a-2 and its second locating module 115-a-2. As a result, the start of the first time by the first locating module 110-a-1 may correspond to the actual or inherent starting of a second timer on the second locating module 110-a-2. Upon receiving the additional transmission, the first locating module 110-a-1 may (effectively) stop the first timer and may determine a RTT by subtracting the predetermined time used by the tag 130 from the elapsed time between the first and second times. Upon receiving the additional transmission, the second locating module 110-a-2 may (effectively) stop the second timer (or send its arrival time for computation by another device (e.g., the device 160, for example). A single trip time for the second anchor 105-a-2 may be determined by subtracting the single trip time to the first anchor 105-a-1 and the predetermined time used at the tag 130 from the elapsed time between transmission from the first anchor 105-a-1 and arrival the second anchor 105-a-2. As a result, location may be determined using TOA.

In some cases, each of the anchors 105 may include the locating module 110. In one example, the first locating module 110-a-1 may communicate with a second anchor 105-a-2 via the second locating module 110-a-2. For example, the second locating module 110-a-2 may execute tuning instructions received from the first locating module 110-a-1. The location determination module 110 is discussed in further detail below.

In some cases, each of the anchors 105 may receive instructions (e.g., tuning information) from the tag management module 165. Additionally, each of the anchors 105 may transmit respective arrival information and/or single trip times to the tag management module 165 (for location determination, for example).

Figure 2:
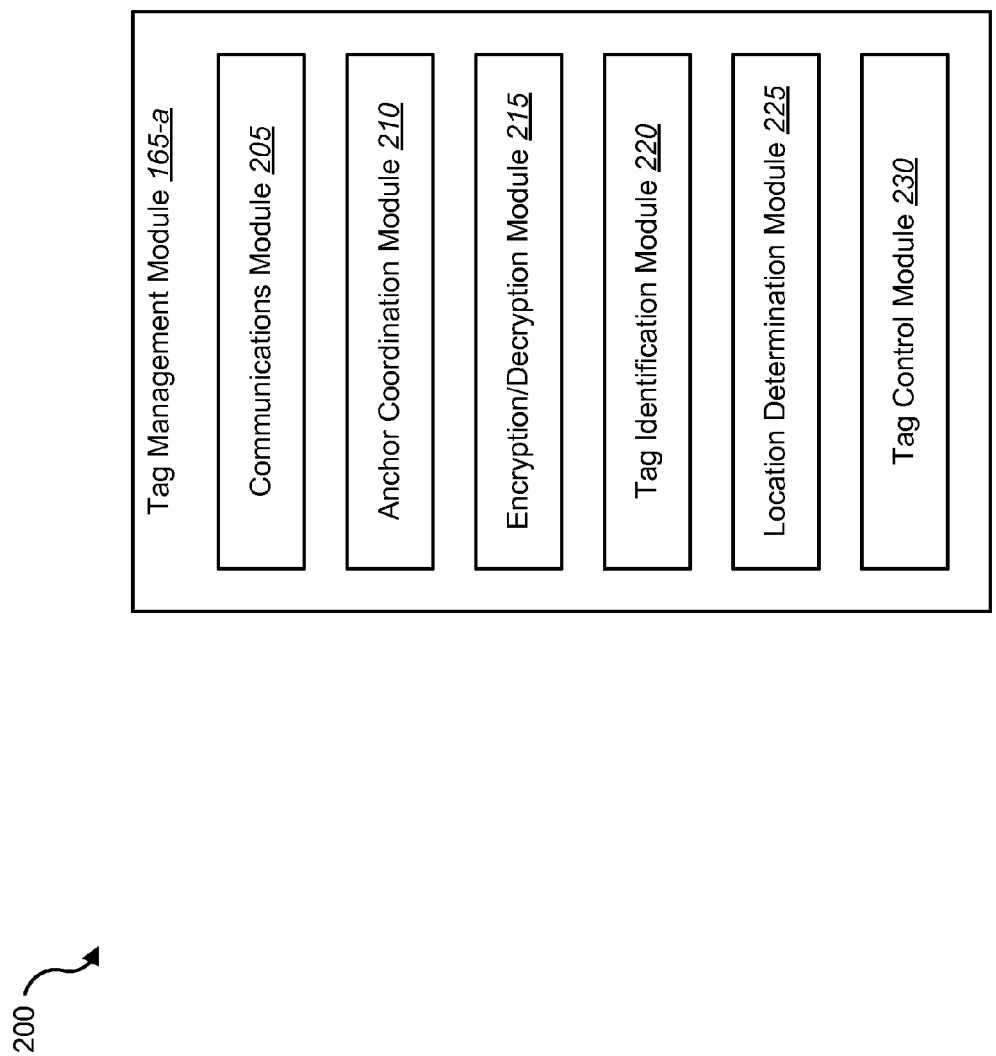
FIG. 2 is a block diagram illustrating one example of a tag management module.

FIG. 2 is a block diagram illustrating one example of a tag management module 165-a. The tag management module 165-a may be one example of the tag management module 165 illustrated in FIG. 1. In some configurations, the tag management module 165-a may include a communications module 205, an anchor coordination module 210, an encryption/decryption module 215, a tag identification module 220, a location determination module 225, and a tag control module 230.

In one embodiment, the communication module 205 may enable communication via the cloud 125. For example, the communications module 205 may enable the tag management module 165 to communicate with the locating modules 110 on each anchor 105. The communications module 205 may also enable the locating modules 110 to communicate with the tag management module 165.

In one embodiment, the anchor coordination module 210 may synchronize the timing and/or the frequency between a set of anchors 105. In another embodiment, the anchor coordination module 210 may synchronize the timing and/or the frequency between one or more anchors 105 and the tag 130. In one example, distance may be determined between the tag 130 and an anchor 105 by changing the frequency by a known amount and determining the change in phase caused by the change in frequency (as described previously). In some cases, the anchor coordination module 210 may allow multiple anchors 105 (owned by different entities, to operate as a team, for example). The anchor coordination module 210 is discussed in further detail below.

In one embodiment, the encryption/decryption module 215 may encrypt and/or decrypt messages. For example, the encryption/decryption module 215 may encrypt/decrypt the data portion (e.g., message portion) of a signal 155. In one example, one or more of the anchors 105 may be owned and/or operated by different entities. For security and/or privacy reasons, the tag management module 165 may encrypt messages that are intended for tags 130 so that the anchor 105 that transmits the message to the tag 130 may not access the contents of the message. Each tag 130 may have a corresponding decryptor/encryptor for decrypting encrypted messages from the tag management module 165 and for transmitting encrypted messages intended for the tag management module 165. Accordingly, the tag management module 165 may decrypt encrypted messages from a tag 130. In one example, the tag identifier may be included in the encrypted message. In one embodiment, the tag identification module 220 may identify tags 130. For example, the tag identification module 220 may identify a tag 130 based on an encrypted tag identifier in a message from the tag 130.

In one embodiment, the location determination module 225 may select one or more location approaches (e.g., TDOA, extended TDOA (ETDOA), TOA) for locating a tag 130. In one example, the location determination module 225 may use at least the anchor coordination module 210 to coordinate a set of anchors for a selected location detection approach. The location determination module 225 is discussed in further detail below.

In one embodiment, the tag control module 220 may send and/or receive management and/or control message to a tag 130 (via an anchor 105, for example) during the tag's 130 listening window. In one example, the tag control module 220 may manage a tag 130 by sending messages (e.g., encrypted messages) to a tag 130 (via an anchor 105). Examples of messages include instructions (e.g., scheduling instructions), updates, patches, firmware, etc. The tag control module 230 is discussed in further detail below.

Figure 3:
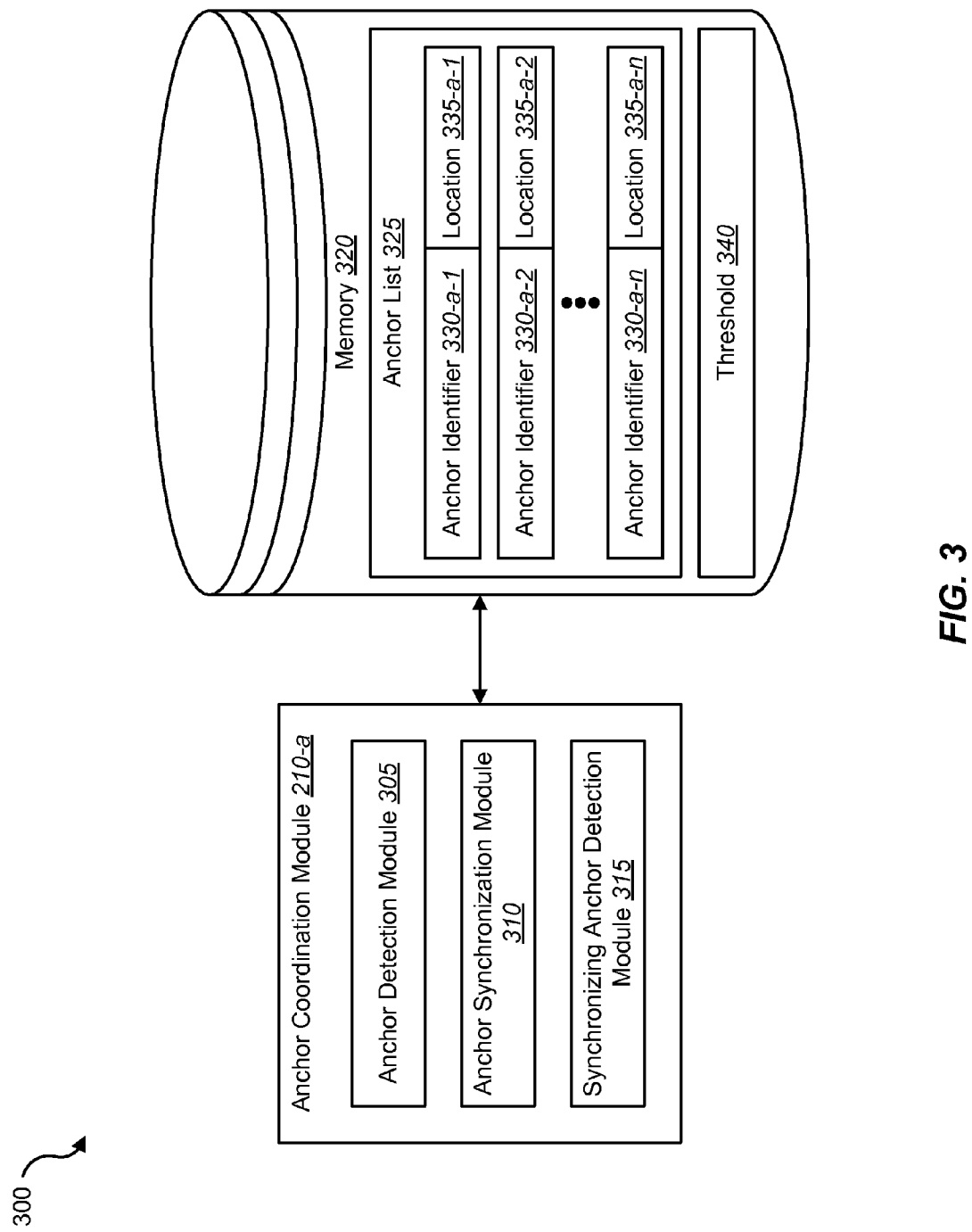
FIG. 3 is a block diagram illustrating one example of an anchor coordination module.

FIG. 3 is a block diagram illustrating one example of an anchor coordination module 210-a. The anchor coordination module 210-a may be one example of the anchor coordination module 210 illustrated in FIG. 2. In some configurations, the anchor coordination module 210-a may include an anchor detection module 305, an anchor synchronization module 310, and a synchronizing anchor detection module 315.

In one embodiment, the anchor detection module 305 may detect one or more anchors 105. For example, the anchor detection module 305 may detect the anchors 105 that may participate in a TDOA, ETDOA, and/or TOA location system. In some configurations, the anchor detection module 305 may detect anchors 105 that are within a certain predetermined area (within a particular threshold 340, for example) around an anchor 105 that received a signal from a tag 130.

In one example, the anchor detection module 305 may identify each anchor 105 (via an anchor identifier 430, for example). In one embodiment, the anchor detection module 305 may determine an identifier for each anchor 105. For example, the anchor identification module 305 may use a hardware identification code associated with the anchor 105 to identify the anchor 105. In some cases, each anchor 105 may provide an identifier in response to a request for an identifier. In some configurations, the anchor detection module 305 may store the anchor identifier 330 of each anchor 105 in a list (e.g., anchor list 325).

In another example, the anchor detection module 305 may identify a location of each (of a set of locating anchors, for example) anchor 105 (via a location 335, for example). In one example, the anchor detection module 305 may request that each anchor 105 respond with its location. In some cases, each anchor 105 may be able to determine its own location (using a global positioning system and/or triangulation based on each other anchor's signals, for example). In some configurations, the anchor detection module 305 may store the location 335 of each anchor 105 in the anchor list 325.

In one embodiment, the anchor detection module 305 may generate and/or update a list of anchors 105 (e.g., an anchor list 325). In some cases, the anchor list 325 may include the set of all anchors 105 in a region (e.g., city, county, state, country, continent, hemisphere, etc.). In other cases, the anchor list 325 may include a subset of all the anchors 105 in a region. In some cases, a region may correspond to a TDOA, ETDOA, TOA location system. For example, the subset of anchors 105 may be the anchors 105 that may be used within a particular geographic area for TDOA, ETDOA, TOA location determination. In some configurations, the anchor list 325 may include an anchor identifier 330 and an anchor location 335 for each anchor 105 in the list. In one example, the anchor list 325 may include information for a first anchor a second anchor and an nth anchor. In this example, the list 325 may include a first anchor identifier 330-a-1 and a first location 335-a-1 for the first anchor 105, a second anchor identifier 330-a-2, and a second location 335-a-2 for the second anchor 105, and an nth anchor identifier 330-a-n and an nth location 335-a-n for the nth anchor. In one example, each of the anchor locations 335 may be within a predetermined threshold 340 (e.g., geographic distance/range threshold). In some configurations, the anchor list 335 may be stored in a memory 320 that is coupled to or otherwise accessible to the tag management module 165. For example, the memory 320 be local to the device 160 or remotely accessible by the device 160.

In one embodiment, the anchor synchronization module 310 may synchronize the timing clocks of each anchor 105. In one example, each anchor 105 may be adjusted to operate according to a set standard (e.g., UTC). In another example, each anchor 105 may be synchronized with another anchor 105 based at least on their relative frequency clocks. In one example, synchronization among anchors 105 may ensure that time of arrival from different anchors may be according to the same timing standard (the synchronizing anchor's timing standard, for example). For instance, the timing between two anchors 105 may be synchronized such that a timer that is started by one anchor may be used by another anchor as if the timer were started on the other anchor. For example, single trip times may be determined based on the arrival information from different anchors and the start time of the synchronizing anchor (in TOA, for example).

In one embodiment, the synchronizing anchor detection module 315 may select an anchor 105 with the best path to a tag 130 (that signal was measured to be the best-received signal of each of the receiving anchors 105, for example). In one example, each anchor 105 may provide signal measurement information about a received signal 155. In one embodiment, the synchronizing anchor detection module 315 may determine a synchronizing anchor 105 and may send instructions to the synchronizing anchor 105 (for the anchor 105 to send messages to the anchor 105, for example). In one example, the synchronizing anchor detection module 315 may select the anchor 105 that will allow for the best path for two-way ranging and two-way communications.

Figure 4:
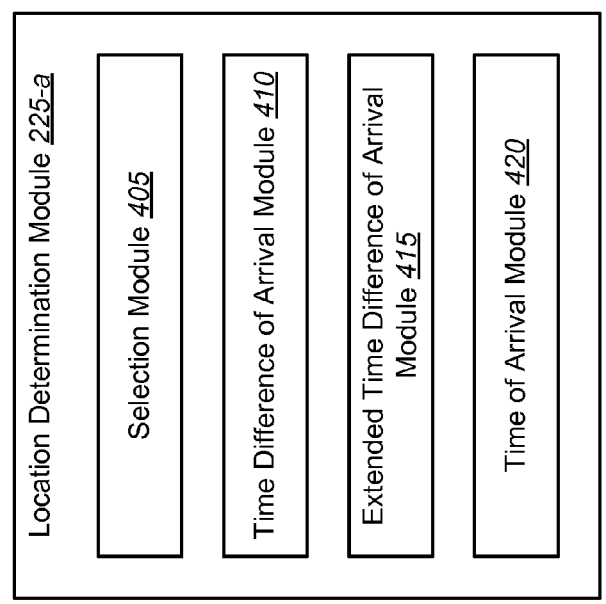
FIG. 4 is a block diagram illustrating one example of a location determination module.

FIG. 4 is a block diagram illustrating one example of a location determination module 225-a. The location determination module 225-a may be one example of the location determination module 225 illustrated in FIG. 2. In some configurations, the location determination module 225-a may include a selection module 405, a time difference of arrival (TDOA) module 410, extended time difference of arrival (ETDOA) module 415, and a timer of arrival (TOA) module 420.

In one embodiment, the selection module 405 may select an appropriate location mode based on the current environment of the tag 130 and/or previous location information for the tag 130. For example, if the tag 130 is not moving, then a more precise (e.g., TOA) location may be accurate until the tag 130 moves. In one example, subsequent location updates may be made using TDOA or ETDOA. Similarly, if the tag 130 is moving, then more frequent TOA may be desired to maintain more precise location of the tag 130.

In one embodiment, the TDOA module 410 may obtain arrival information from multiple anchors 105 and may determine the location of a tag 130 based on the arrival information from each receiving anchor 105 and the known location of each receiving anchor 105 (using TDOA, for example). In some cases, the TDOA module 410 may output the location of a tag 130 to a user (for display on a webpage, for example).

Figure 7:
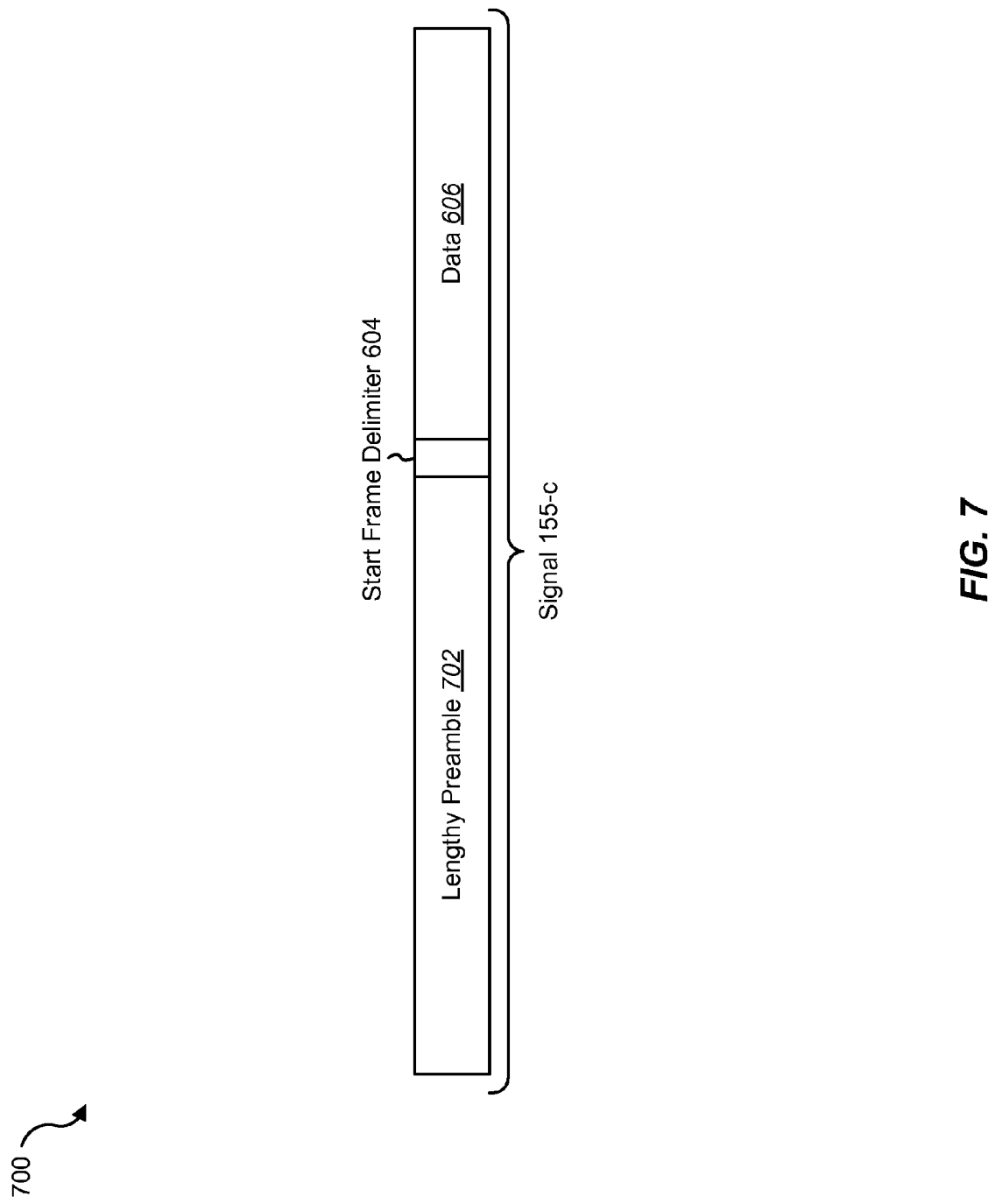
FIG. 7 is a block diagram illustrating another example of a signal that may be transmitted by a tag.

In one embodiment, the ETDOA module 415 may function similarly to the TDOA module 410 except that in ETDOA, the tag 130 may be instructed to (or may on its own) send one or more signals 155 with a longer preamble (as illustrated in FIG. 7, for example).

In one embodiment, the TOA module 420 may determine location based on two-way ranging and direct time of arrival. In one example, the anchor 105 may mark a start time when the signal is sent to the tag 130 (during the listening window). The tag may reply according to a predetermined delay, and upon arrival of the tag's reply, a stop time may be marked. The elapsed time between the start time and the stop time minus the predetermined delay may be the RTT. The trip time to other anchors may be determined based on their arrival times and the known RTT.

Figure 5:
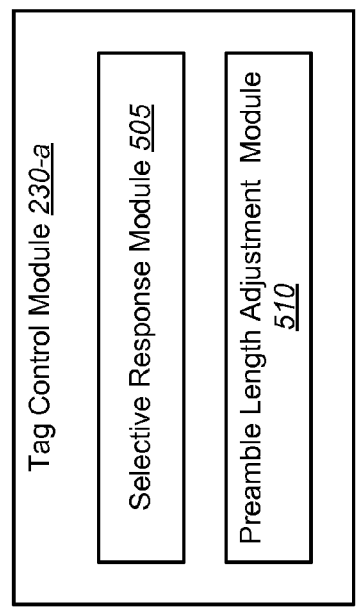
FIG. 5 is a block diagram illustrating one example of a tag control module.

FIG. 5 is a block diagram illustrating one example of a tag control module 230-a. The tag control module 230-a may be one example of the tag control module 230 illustrated in FIG. 2. In some configurations, the tag control module 230-a may include a selective response module 505, and a preamble length adjustment module 510.

In one embodiment, the tag control module 230-a may send control and/or instructional messages to a tag 130. For example, the tag control module 230-a may transmit information about how the tag 130 should manage its operations, information that improves the ability of the tag 130 to manage itself, etc. In one example, the tag control module 230-a may additionally allow an anchor 105 to also provide particular instructions to the tag 130.

Figure 6:
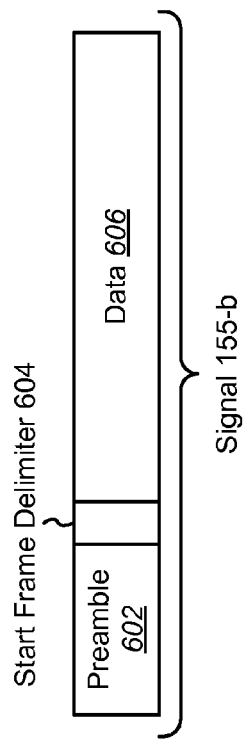
FIG. 6 is a block diagram illustrating one example of a signal that may be transmitted by a tag.

In one embodiment, the selective response module 505 may instruct the tag 130 to make/or not make an additional transmission in response to a received message. In one example, each message sent to the tag 130 may include a bit flag indicating whether an additional transmission should be made (or should not be made). In one embodiment, the preamble length adjustment module 510 may instruct a tag 130 to adjust the length of the preamble for an additional transmission, the next epoch transmission, and/or on every transmission until instructed otherwise. For example, the preamble length adjustment module 510 may instruct a tag 130 to transmit using a standard preamble (e.g., 1 millisecond) or to transmit using a lengthy preamble (e.g., 4 milliseconds). For instance, the lengthy preamble may be used for ETDOA location. In one example, the preamble length adjustment module 510 may instruct the tag 130 to use a long preamble on the next epoch transmission. In one example, increasing the preamble length may allow for increased integration on the (repeated, for example) preamble. As a result, the preamble which might otherwise be lost in the noise, may be detected (e.g., rise from the noise—due to the cyclic integration over a greater number of preamble symbols, for example). FIGS. 6 and 7 illustrate examples of signals 155 having different preamble lengths.

FIG. 6 is a block diagram illustrating one example of a signal 155-b that may be transmitted by a tag 130. The signal 155-b may be one example of the signal 155 illustrated in FIG. 1. In some configurations, the signal 155-b may include a preamble 602, a start frame delimiter (SFD) 604, and data 606.

In one embodiment, the preamble 602 may be a standard set of information (that is defined by the standard IEEE 802.15.4, for example). In one example, the tags 130 and the anchors 105 may have distinct preambles 602. In FIG. 6, the signal 155-b may include a standard length preamble 602 (1 ms preamble, for example). In one embodiment, the start frame delimiter 704 may indicate the start of the data 706 portion of the signal 155-b.

In one embodiment, the data 606 may include identifying information about the tag 130. For example, the data 606 may include information that identifies a tag (e.g., a tag identifier). In one example, the tag identifier may be encrypted. In another example, the data 606 (e.g., the entire data portion of the signal 155-b, the portion of the signal 155-b following the SFD 604) may be encrypted. In some cases, encryption of the data 606 may allow prevent anchors 105 from gaining access to the data 606 (the data 606 may only decrypted by tag management module 165, for example).

In some configurations, the known data 606 (determined by a anchor 130 in close proximity to the tag 130, for example) may be provided to the other anchors 105 through the cloud 125. In some cases, each of the other anchors 105 may use the pre-knowledge of the known signal 155-b to enhance the reception and/or detection of the signal 155-b. For example, even if the Shannon limit would not allow demodulation of the data 606 at a particular range, the signal may still be detected using the pre-knowledge of the known signal 155-b. In some configurations, the pre-knowledge of the known data 606 may be used to improve correlation decisions, integration, and detection of the signal 155-b.

FIG. 7 is a block diagram illustrating another example of a signal 155-b that may be transmitted by a tag 130. The signal 155-b may be another example of the signal 155 illustrated in FIGS. 1 or 6. In some configurations, the signal 155-b may include a lengthy preamble 702 (a 4 ms preamble, for example), the start frame delimiter (SFD) 604, and the data 606. In this example, the signal 155-c may be similar to the signal 155-b, except that signal 155-c includes the lengthy preamble 702 instead of the standard preamble 602. As noted above, the lengthy preamble 702 may allow for more integration of preamble symbols, which may allow for up to 6 dB of additional gain (which may allow for signal detection when it might otherwise be lost in the noise).

Figure 8:
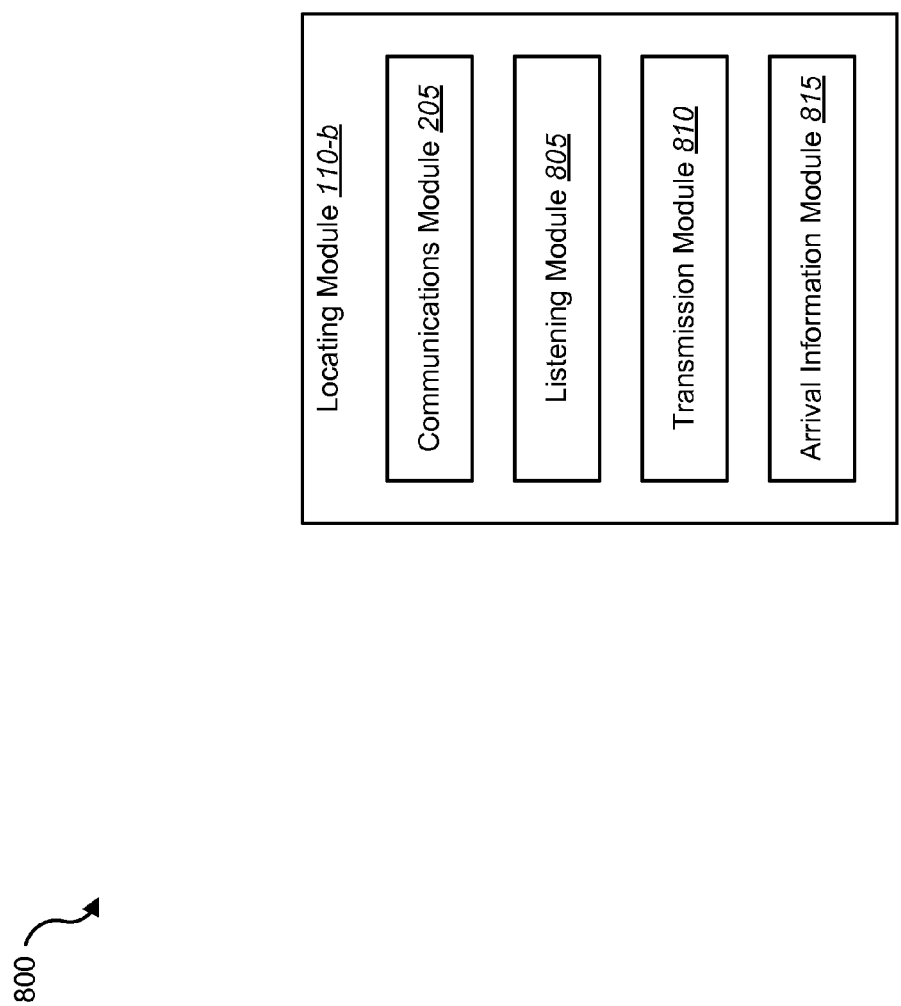
FIG. 8 is a block diagram illustrating one example of a locating module.

FIG. 8 is a block diagram illustrating one example of a locating module 110-b. The locating module 110-b may be one example of the locating module 110 illustrated in FIG. 1. In some configurations, the locating module 110-b may include the communication module 205, a listening module 805, a transmission module 810, and an arrival information module 815.

In one embodiment, the communication module 205 was described previously with respect to FIG. 2. In some configurations, the communication module 205 may use resources that are separate from the resources used to send transmissions to or receive transmissions from the tag 130 (e.g., transceiver 115).

In one embodiment, the listening module 805 may listen for tag transmissions. As discussed above, the listening module 805 may use various correlation and/or integration processes to detect tag transmissions. In one embodiment, the listening module 805 may receive one or more transmissions of a signal 155. In some configurations, the listening module 805 may determine the precise frequency, symbol timing, signal timing, and message content of a signal 155. In some cases, the listening module 805 may also tune a transceiver 115 to be able to detect a signal 155 at a precise frequency having particular symbol timing, and content at a particular time (based on the signal timing, for example). In some configurations, the listening module 805 may determine an arrival time for a received signal (for TDOA, ETDOA, TOA location, for example). The listening module 805 is discussed in further detail below.

In one embodiment, the transmission module 810 may send messages (received from the tag management module 165, for example) to a tag 130. In one example, the transmission module 810 may determine the a period of time that the tag 130 may be listening and may transmit a message to the tag 130 during the period that the tag 130 may be listening. For instance, the transmission module 810 may transmit instructions, updates, patches, firmware, etc. to a tag 130 during the tag's 130 listening window. It may be noted, that a tag 130 may only receive messages during a (perhaps very limited) listening period of time.

In one embodiment, the arrival information module 815 may determine a time of arrival for a signal from a tag 130. In some cases, the arrival information module 815 may determine a round trip time, single trip time, or distance to a tag 130. The arrival information module 815 may send the determined arrival information to the tag management module 165 (via the communications module 205, for example).

Figure 9:
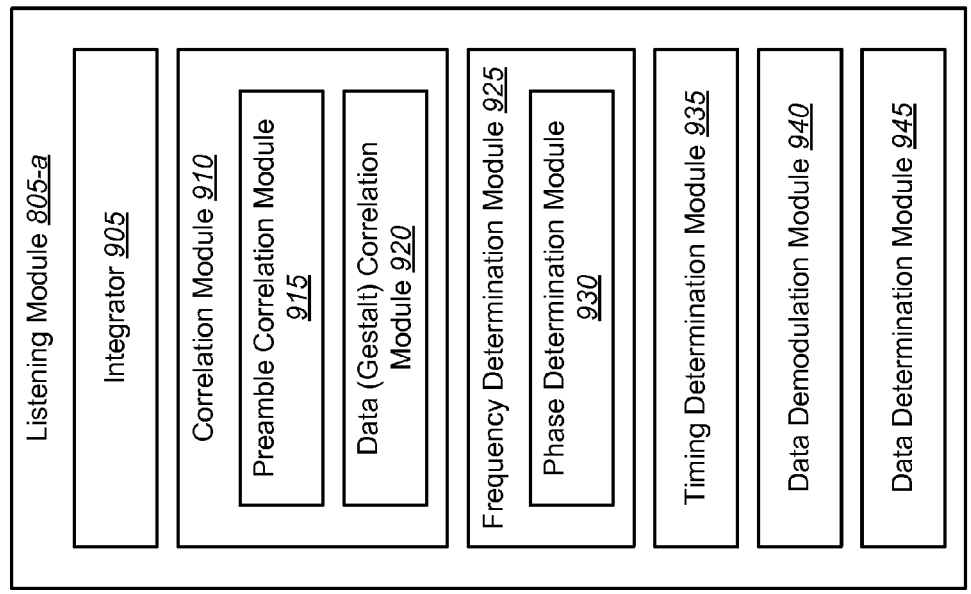
FIG. 9 is a block diagram illustrating one example of a listening module.

FIG. 9 is a block diagram illustrating one example of a listening module 805-a. The listening module 805-a may be one example of the listening module 805 illustrated in FIG. 8. In some configurations, the listening module 805-a may include an integrator 905, a correlation module 910, a frequency determination module 925, a timing determination module 935, and data demodulation module 940, and a data determination module 945.

In one embodiment, the integrator 905 may integrate (e.g., cyclically integrate) over some portion or all of message (as described herein) to help extract and detect the signal from the noise floor.

In one embodiment, the correlator module 910 may include a preamble correlation module 915 and a data (gestalt) correlation module 920. In one embodiment, the preamble correlation module 915 may perform a long cyclic integration with frequency offset over the preamble symbols to detect the preamble. In some cases, the preamble correlation module 910 may determine a modular timing of the signal. In one embodiment, the data (gestalt) correlation module may correlate over the entire message (e.g., data 606) using a one or more data patterns (e.g., data sequences, metabits). For instance, using the data sequence determined by an anchor in close proximity to the tag 130. It may be noted, that the data (gestalt) correlation module 920 may correlate a portion of a message at a known frequency, known time, known modular timing, and known set of data patterns, which may result in a single correlation spike when the entire portion of the message correlates with one of the data patterns. Gestalt correlation is discussed in greater detail in FIG. 24 below.

In one embodiment, the frequency determination module 925 may determine the frequency of the transmitted signal 155. For example, the frequency determination module 925 may use a frequency-tracking loop to determine the precise frequency of the transmitted signal 155. In some cases, determining the precise frequency of the transmitted signal 155 may allow the signal to be distinguished from the noise in extended range reception. In some configurations, the frequency determination module 925 may include a phase determination module 930.

In one embodiment, the phase determination module 930 may determine precise phase of the signal 155. In some cases, the phase of the signal 155 may be determined using a phase tracing loop. As described previously, in some configurations (when the tag and the anchor have common timing and frequencies, for example), a predetermined change in frequency may be made and the phase change measured to determine the distance between the tag 130 and the anchor 105. In some cases, the phase determination module 930 may determine the phase rotation based on the timing between modulated signal and the receiver's frequency. In some cases, phase rotation between these measurements may be used to better determine the exact frequency used by the tag 130.

In one embodiment, the timing determination module 935 may determine the symbol timing of the signal 155. In some case, having known symbol timing may improve the reception of an extended range signal 155. For instance, a distant anchor may utilize the known frequency of a signal, known timing of a signal, and known symbol timing (e.g., cadence) of a signal 155 to detect (using gestalt correlation, for example) a signal 155 that is below the Shannon limit.

In one embodiment, the data demodulation module 935 may demodulate the message (e.g., data 606) using known demodulation techniques. In some case, demodulating a message may result in data that may be detected via data determination module 940. It may be noted, that if the message is encrypted then demodulating the message may provide encrypted content. In one example, the tuning information (e.g., frequency information), timing information, and/or content of the message (encrypted content, for example) may be transmitted to the tag management module 165.

Figure 10:
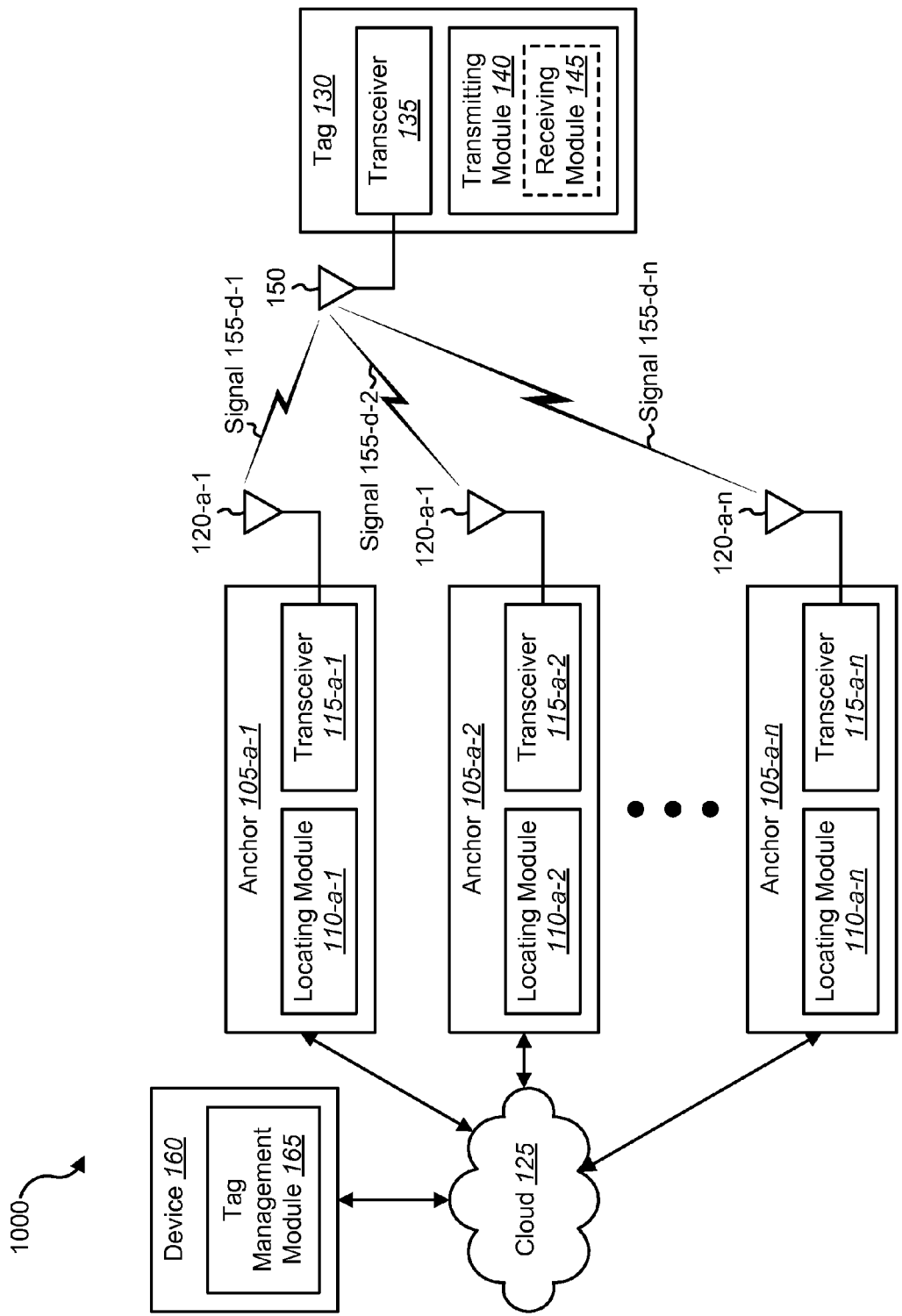
FIG. 10 is a block diagram illustrating another example of a TDOA, ETDOA, TOA system.
Figure 11:
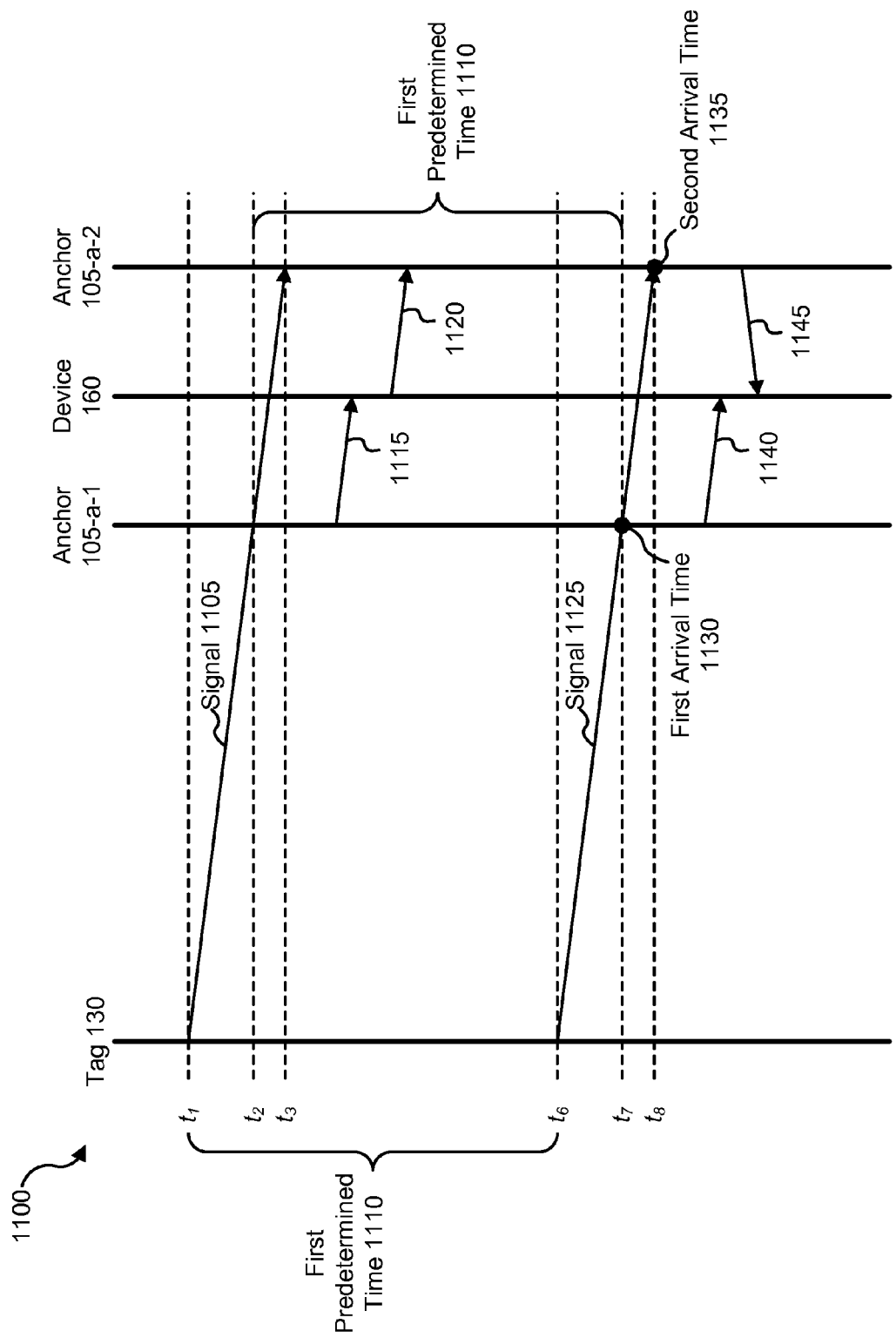
FIG. 11 is a thread diagram illustrating one example of the signaling involved in a TDOA location.
Figure 12:
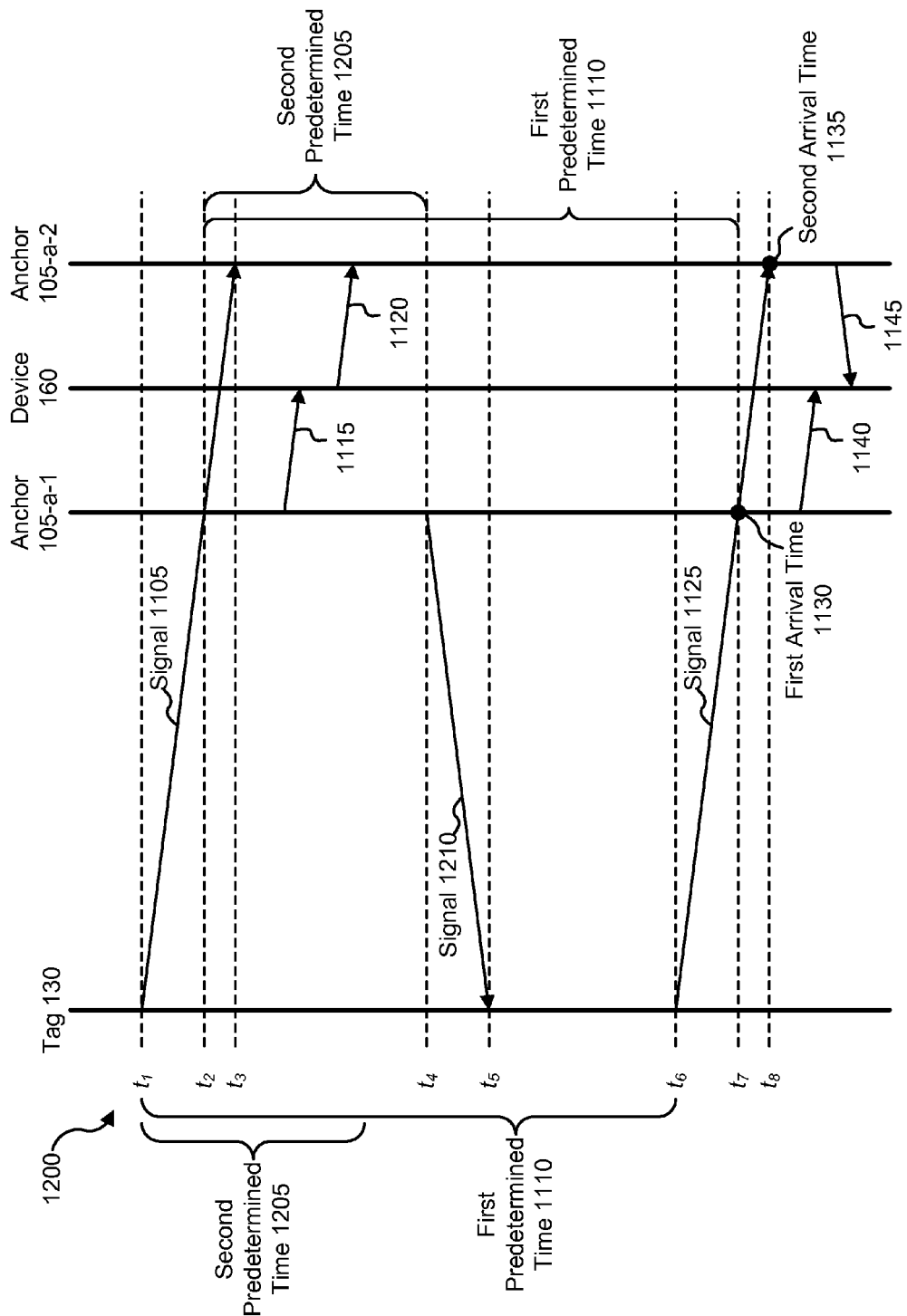
FIG. 12 is a thread diagram illustrating one example of the signaling involved in a ETDOA location using the tag listening window.
Figure 13:
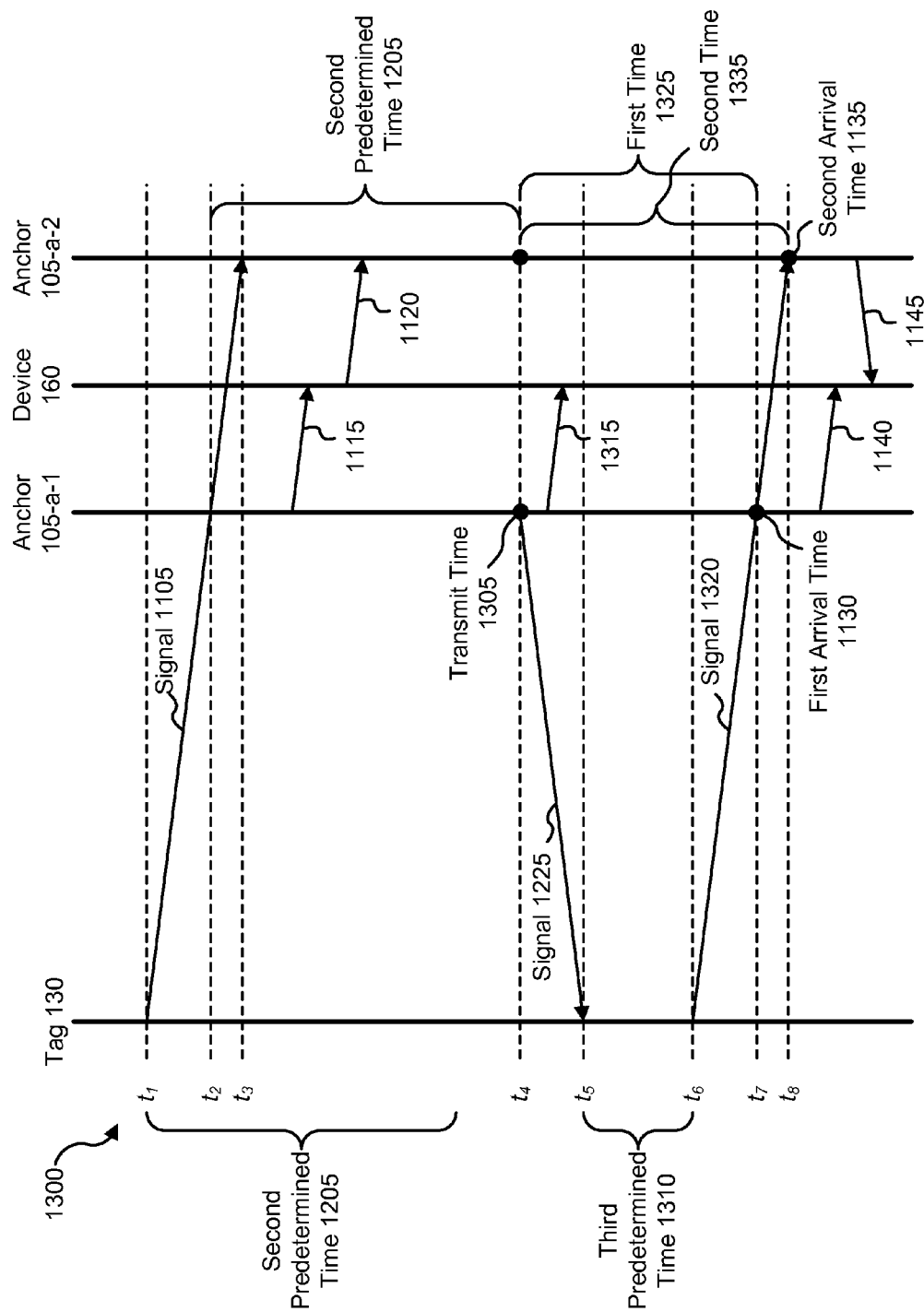
FIG. 13 is a thread diagram illustrating one example of the signaling involved in a TOA location using the tag listening window and selective signaling.

FIG. 10 is a block diagram 1000 illustrating another example of a TDOA, ETDOA, TOA system. In one example, the tag 130 may transmit a signal 155 via the transceiver 135 and the antenna 150. As described with respect to environment 100 as illustrated in FIG. 1, similar environment 1000 may enable TDOA, ETDOA, and/or TOA location. FIGS. 11-13 help illustrate the signaling between the tag 130, the anchors 105, and the tag device 160 as illustrated in FIG. 10. While FIGS. 11-13 reference a first anchor 105-a-1 and a second anchor 105-a-2, it may be noted that more anchors may participate (in a similar way to the second anchor 105-a-2). For example, FIG. 10 illustrates that there may be n different anchors 105 that may receive the signal 155 and may provide arrival information to the tag management module 165.

FIG. 11 is a thread diagram 1100 illustrating one example of the signaling involved in a TDOA location. The tag 130 may transmit a signal 1105 (e.g., signal 155-b) at a first time which may be received by a first anchor 105-a-1 (e.g., the synchronization anchor) at a second time and possibly received by the second anchor 105-a-2 (although, most likely not) at a third time. The tag 130 may be transmitting epochs according to a first predetermined time 1110. Upon receiving the signal 1105, the first anchor 105-a-1 may determine the frequency, cadence, timing, content, etc. of the signal 1105. In one example, the first anchor 105-a-1 may determine a projected time (e.g., a seventh time) for the next transmission based on the first predetermined time 1110. The first anchor 105-a-1 may communicate at least a portion of this information about the signal 1105 to the device 160 via communication 1115. The device 160 may provide this or similar information to the second anchors 105-a-2 via communication 1120. At a sixth time (e.g., the expiration of the first predetermined time 1110), the tag 130 may transmit a second signal 1125. The second signal 1125 may be received at the first anchor 105-a-1 at the seventh time (e.g., a first arrival time 1130) and may be received at the second anchor 105-a-2 at an eighth time (e.g., a second arrival time 1145). In one example, the second anchor 105-a-2 may have received the second signal 1125 based on the information received from the device 160 (in communication 1120, for example). In one example, the first anchor 105-a-1 may transmit the first arrival time 1130 to the device 160 via communication 1140. In one example, the second anchor 105-a-2 may transmit the second arrival time 1135 to the device 160 via communication 1145. The device 160 may use the arrival times received to determine a location based on TDOA.

FIG. 12 is a thread diagram 1200 illustrating one example of the signaling involved in a ETDOA location using the tag 130 listening window. The thread diagram 1200 is similar to the thread diagram 1100 of FIG. 11 except that in thread diagram 1200, the tag 130 may listen for a period of time. In one example, the device 160 may send a communication (not shown) to the first anchor 105-a-1 indicating that the first anchor 105-a-1 should send a message to the tag 130. The listening time period for the tag 130 may be a second predetermined time 1205 after the transmission of an epoch (e.g., signal 1105). Based on the second predetermined time 1205, the first anchor 105-a-1 may transmit a signal 1210 to the tag 130. The signal 1210 may be received at the tag 130 at a fifth time period. In this example (e.g., TDOA), the signal 1210 may instruct the tag 130 to transmit its next scheduled transmission using a longer preamble (e.g., signal 155-c as illustrated in FIG. 7). The next transmission (e.g., signal 1125) with the longer preamble may be received as described above. The longer preamble may allow the second anchor 105-a-2 to be able to detect the signal 1125 at greater distances.

FIG. 13 is a thread diagram 1300 illustrating one example of the signaling involved in a TOA location using the tag 130 listening window and selective signaling. The thread diagram 1300 is similar to the thread diagrams 1100 or 1200 of FIG. 11 or 12 except that in thread diagram 1300, the tag 130 may selectively make an unscheduled transmission (e.g., an additional transmission—if instructed to, for example) after a third predetermined time 1310 triggered by the reception of signal 1225. It may be noted, that the additional transmission may be used for two-way ranging and/or two-way communication. In one example, the first anchor 105-a-1 may mark the transmit time 1305 for the transmission of the signal 1225. In one example, the first anchor 105-a-1 may communicate the transmit time 1305 to the device 160. If the second anchor 105-a-2 is synchronized with the first anchor 105-a-1, then the transmit time 1305 may be an effective time marker for timing at the second anchor 105-a-2.

At the sixth time (e.g., the expiration of the third predetermined time 1340), the tag 130 may transmit a second signal 1320, which may be received as discussed above. However, the first arrival time 1130 and the transmit time 1305 may be used to determine an elapsed time (e.g., first time 1325). A round trip time may be determined from the first time 1325 by subtracting the third predetermined time 1310 (this calculation may be performed at the anchor 105-a-1 or at the device 160). Similarly, the second arrival time 1135 may be used to determine an elapsed time (e.g., second time 1335) with respect to the second anchor 105-a-2. A single trip time to the second anchor 105-a-2 may be determined from the second time 1335 by subtracting the third predetermined time 1310 and a single trip time to the first anchor 105-a-1 from the second time 1335. The round trip time and/or the single trip times may calculated be used to precisely locate the tag 130 using TOA.

Figure 14:
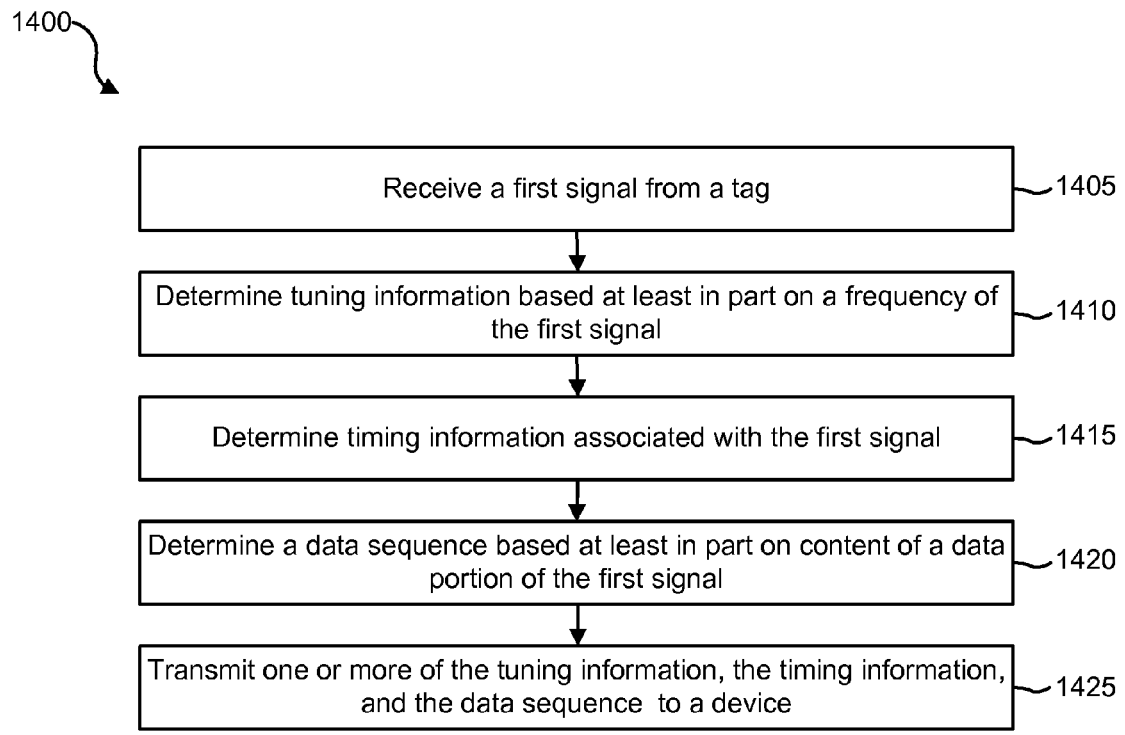
FIG. 14 is a flow diagram illustrating one example of a method for locating an object.

FIG. 14 is a flow diagram illustrating one example of a method 1400 for locating an object. The method 1400 may be implemented by the locating module 110 illustrated in FIG. 1, 8, or 10.

At block 1405, a first signal may be received from a tag. At block 1410, tuning information may be determined based at least in part on a frequency of the first signal. At block 1415, timing information associated with the first signal may be determined. At block 1420, a data sequence may be determined based at least in part on content of a data portion of the first signal. At block 1425, one or more of the tuning information, the timing information, and the data sequence may be transmitted to a device.

Figure 15:
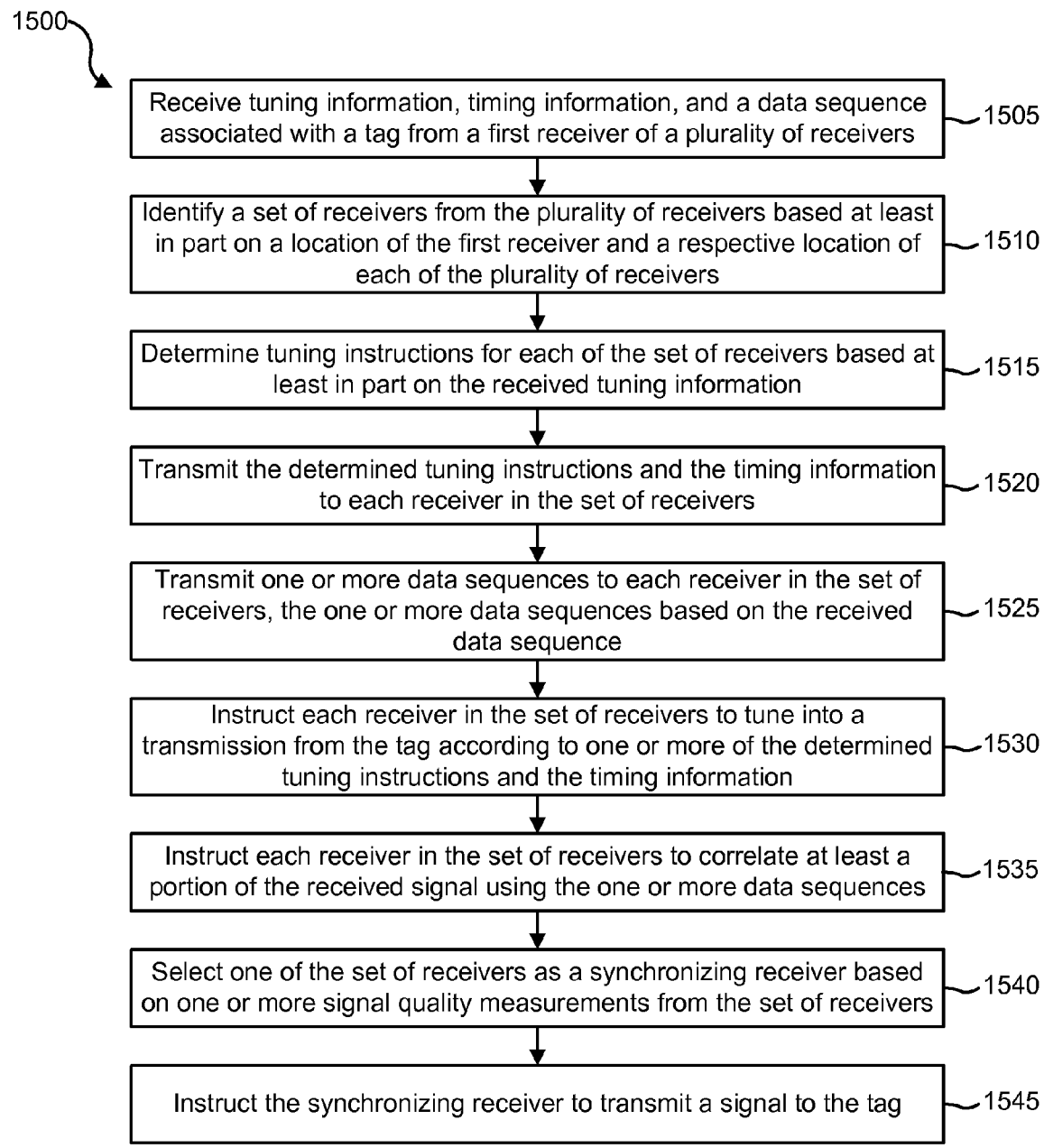
FIG. 15 is a flow diagram illustrating one example of a method for locating an object.

FIG. 15 is a flow diagram illustrating one example of a method 1500 for locating an object. The method 1500 may be implemented by the tag management module 165 illustrated in FIGS. 1, 2, or 10.

At block 1505, tuning information, timing information, and a data sequence associated with a tag may be received from a first receiver of a plurality of receivers. At block 1510, a set of receivers may be identified from the plurality of receivers based at least in part on a location of the first receiver and a respective location of each of the plurality of receivers. At block 1515, tuning instructions may be determined for each of the set of receivers based at least in part on the received tuning information. At block 1520, the determined tuning instructions and the timing information may be transmitted to each receiver in the set of receivers. At block 1525, one or more data sequences may be transmitted to each receiver in the set of receivers. The one or more data sequences may be based on or may include the received data sequence. At block 1530, each receiver in the set of receivers may be instructed to tune into a transmission from the tag according to one or more of the determined tuning instructions, and the timing information. At block 1535, each receiver in the set of receivers may be instructed to correlate at least a portion of the received signal using the one or more data sequences. At block 1540, one of the set of receivers may be selected as a synchronizing receiver based on one or more signal quality measurements received from the set of receivers. At block 1545, the synchronizing receiver may be instructed to transmit a signal to the tag.

Figure 16:
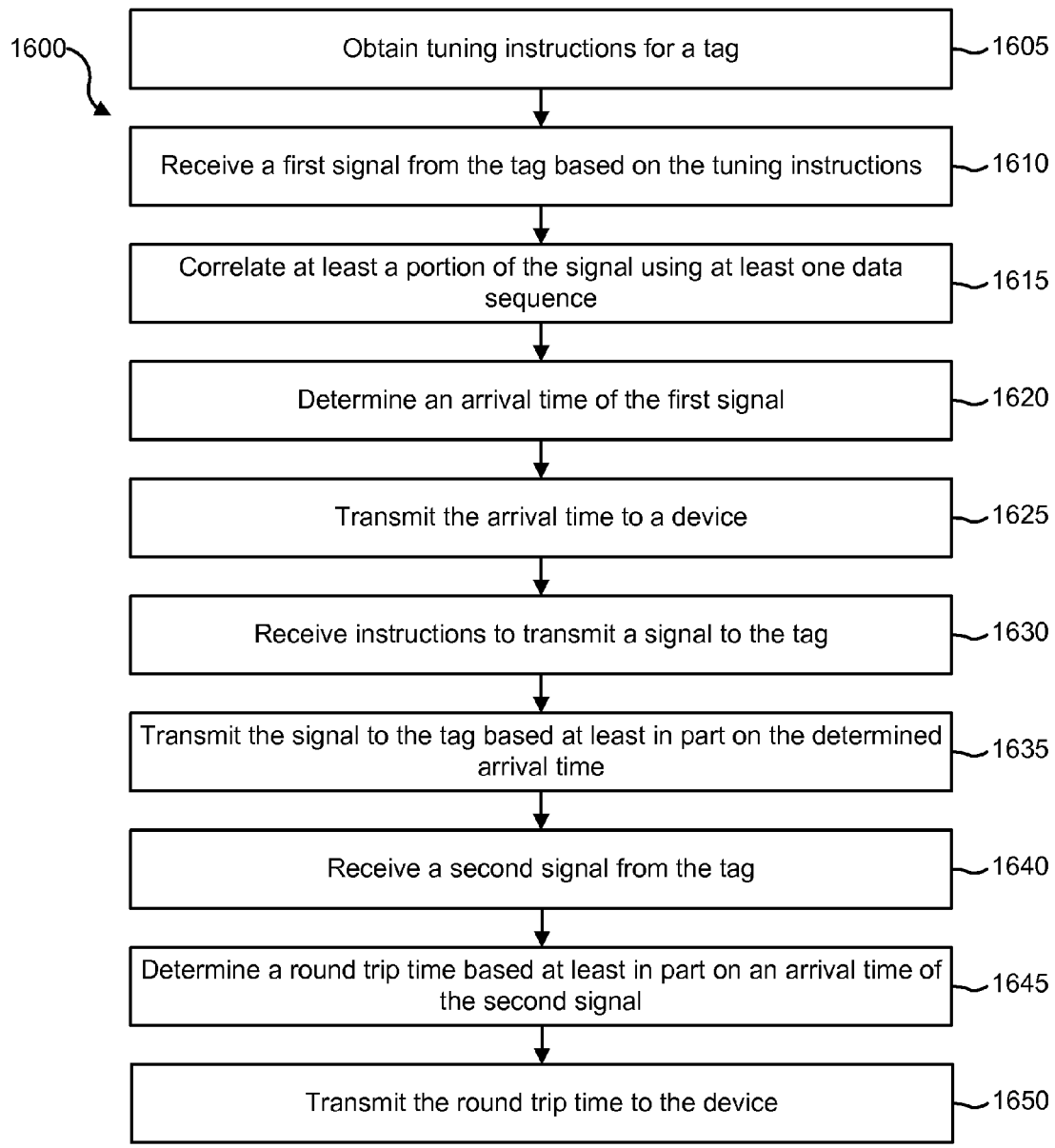
FIG. 16 is a flow diagram illustrating one example of a method for locating an object.

FIG. 16 is a flow diagram illustrating one example of a method 1600 for locating an object. The method 1600 may be implemented by the locating module 110 illustrated in FIGS. 1, 8, or 10.

At block 1605, tuning instructions for a tag may be obtained. For example, a receiver may be the one that detected the tuning instructions or the receiver may have received the tuning instructions from a device. At block 1610, a first signal from the tag may be received based on the tuning instructions. At block 1615, at least a portion of the signal may be correlated using at least one data sequence. At block 1620, an arrival time of the first signal may be determined. At block 1625, the arrival time may be transmitted to a device. At block 1630, instructions to transmit a signal to the tag may be received. At block 1635, the signal may be transmitted to the tag base at least in part on the determined arrival time. At block 1640, a second signal may be received from the tag. At block 1645, a round trip time may be determined based at least in part on an arrival time of the second signal. At block 1650, the round trip time may be transmitted to the device.

Figure 17:
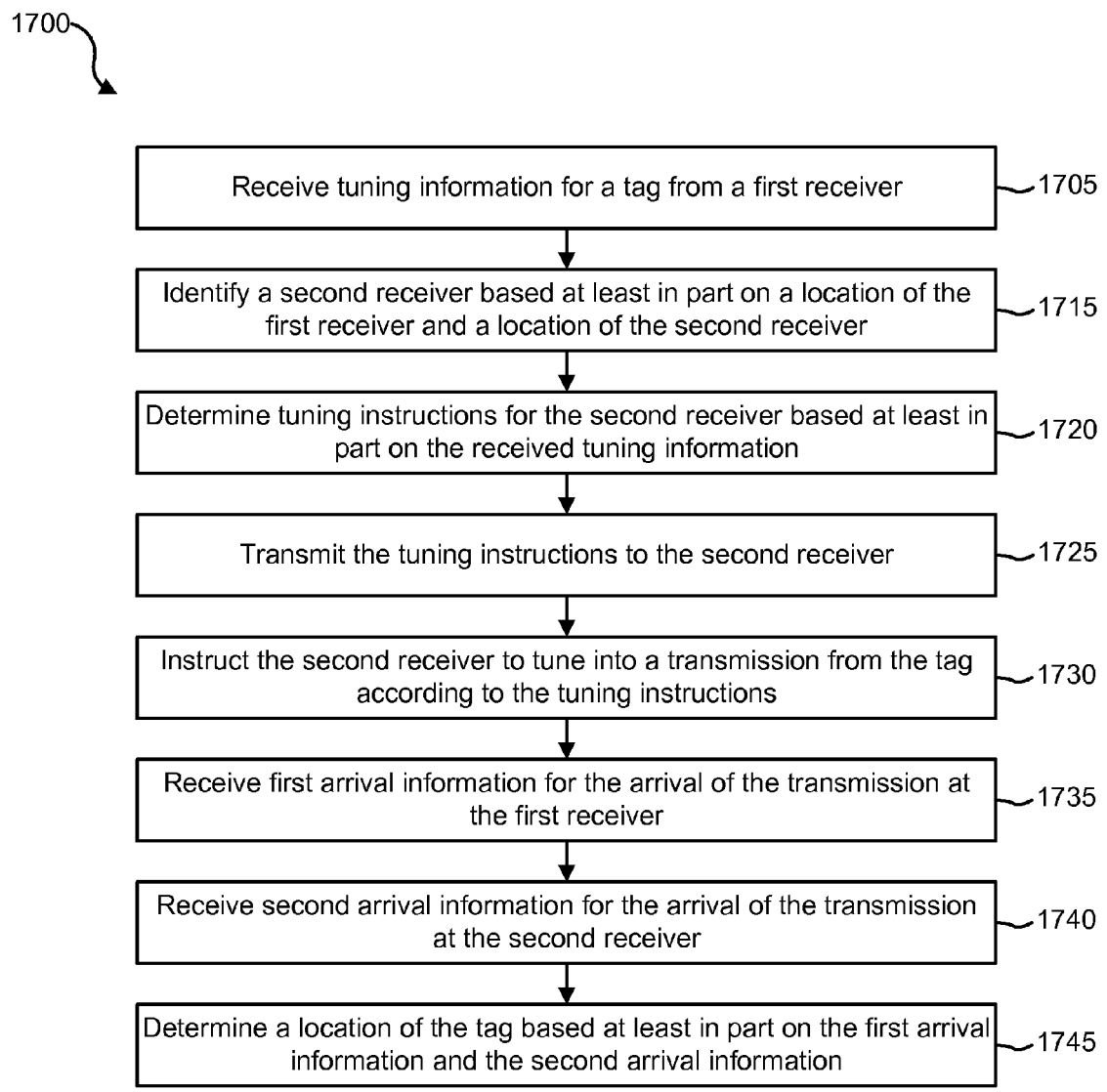
FIG. 17 is a flow diagram illustrating one example of a method for locating an object.

FIG. 17 is a flow diagram illustrating one example of a method 1700 for locating an object. The method 1700 may be implemented by the tag management module 165 illustrated in FIGS. 1, 2, or 10.

At block 1705, tuning information for a tag may be received from a first receiver. At block 1710, a second receiver may be identified based at least in part on a location of the first receiver and a location of the second receiver. At block 1725, the tuning instructions may be transmitted to the second receiver. At block 1730, the second receiver may be instructed to tune into a transmission form the tag according to the tuning instructions. At block 1735, first arrival information for the arrival of the transmission at the first receiver may be received. At block 1740, second arrival information for the arrival of the transmission at the second receiver may be received. At block 1745, a location of the tag may be determined based at least in part on the first arrival information and the second arrival information.

Figure 18:
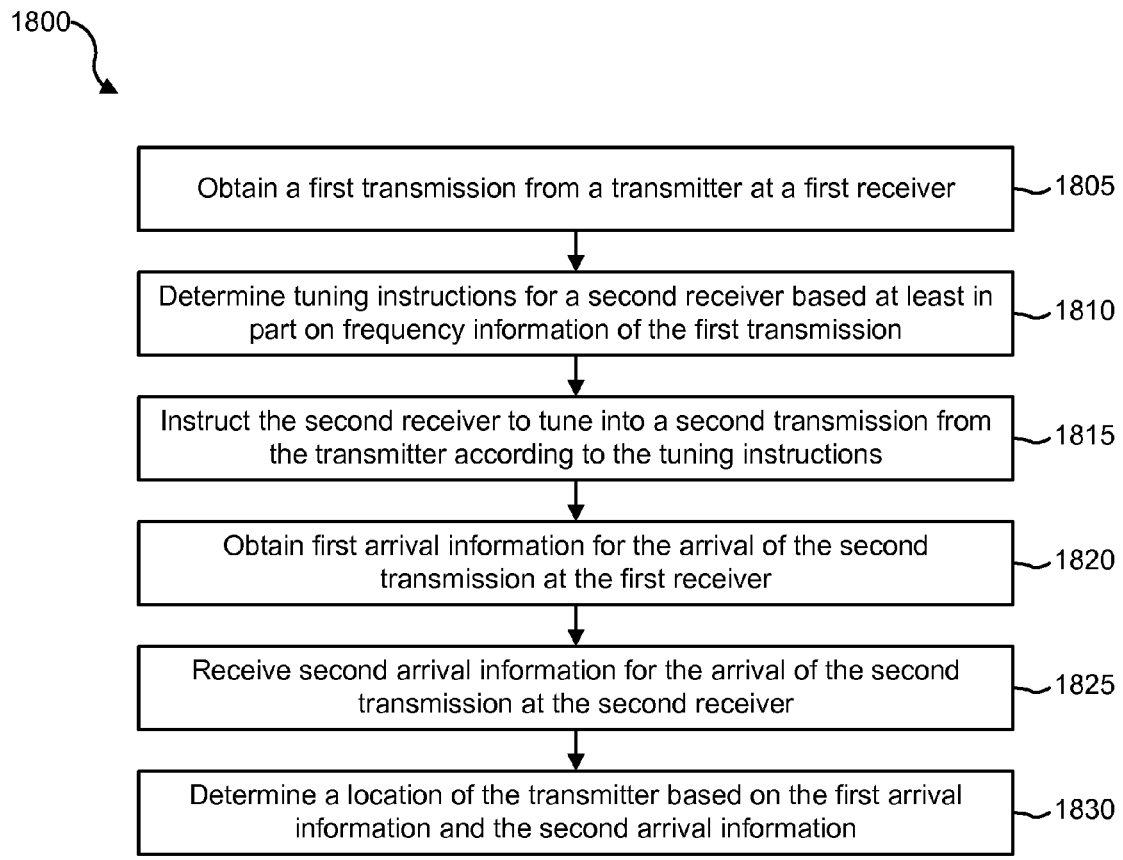
FIG. 18 is a flow diagram illustrating one example of a method for locating an object.

FIG. 18 is a flow diagram illustrating one example of a method 1800 for locating an object. The method 1800 may be implemented by the tag management module 165 illustrated in FIGS. 1, 2, or 10.

At step 1805, a first transmission may be obtained from a transmitter at a first receiver. At step 1810, tuning instructions for a second receiver may be determined based at least in part on frequency information determined for the first transmission. At step 1815, the second receiver may be instructed to tune into a second transmission from the transmitter according to the tuning instructions. At step 1820, first arrival information may be obtained for the arrival of the second transmission at the first receiver. At step 1825, second arrival information may be received for the arrival of the second transmission at the second receiver. At step 1830, a location of the transmitter may be determined based on the first arrival information and the second arrival information.

Figure 19:
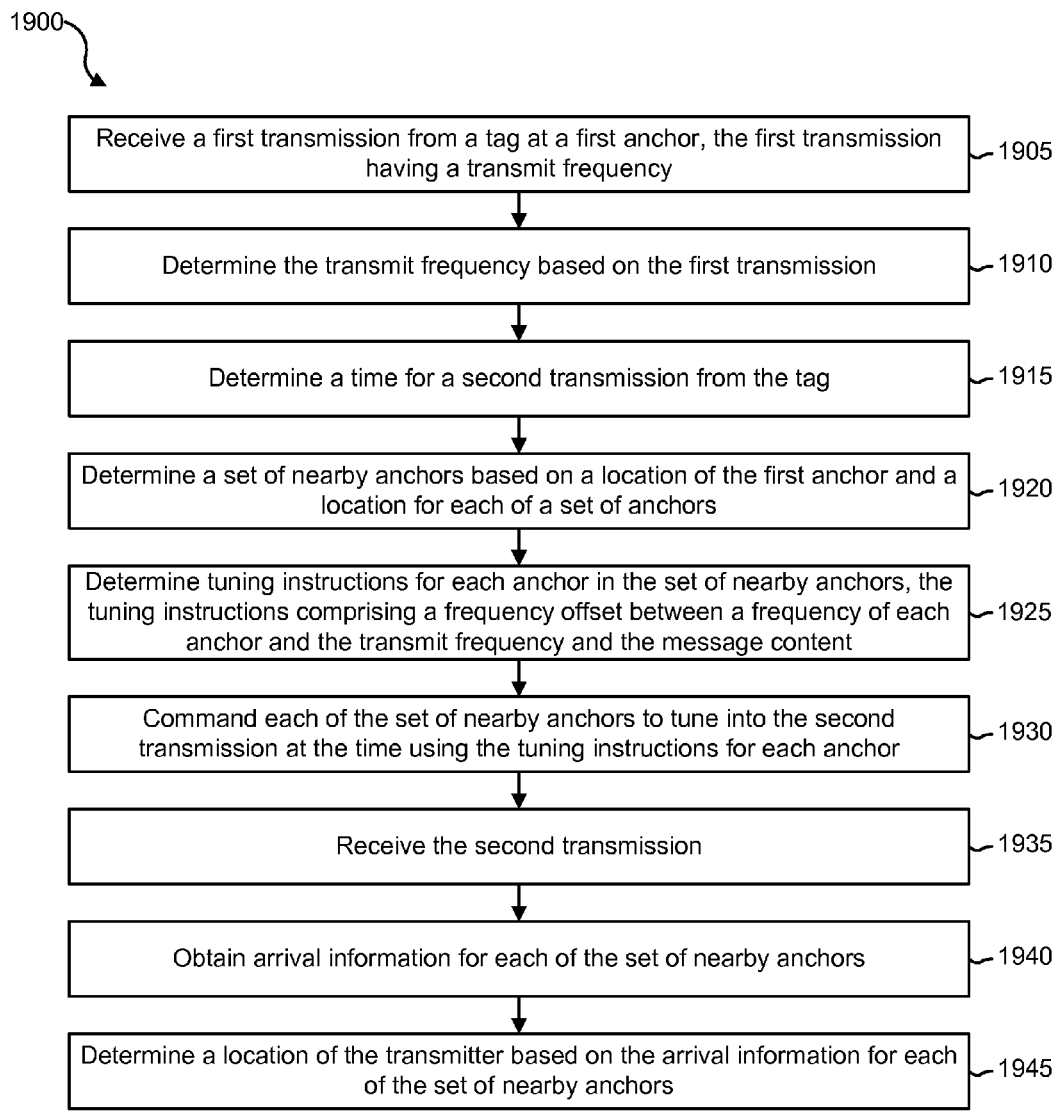
FIG. 19 is a flow diagram illustrating another example of a method for locating an object using TDOA.

FIG. 19 is a flow diagram illustrating another example of a method 1900 for locating an object using TDOA. The method 1900 may be implemented by the locating module 110 illustrated in FIGS. 1, 8, or 10.

At step 1905, a first transmission may be received from a tag at a first anchor, the first transmission having a transmit frequency. At step 1910, the transmit frequency may be determined based on the first transmission. At step 1915, a time for a second transmission from the tag may be determined. At step 1920, a set of nearby anchors may be determined based on a location of the first anchor and a location for each of a set of anchors. For example, the set of nearby anchors may be determined using an anchor list. In some configurations, the set of nearby anchors may include the first anchor 105-a-1. At step 1925, tuning instructions may be determined for each anchor in the set of nearby anchors, the tuning instructions comprising a frequency offset between a frequency of each anchor and the determined transmit frequency. At step 1930, each of the set of nearby anchors may be commanded to tune into the second transmission at the determined time using the tuning instructions for each anchor. At step 1935, the second transmission may be received. At step 1940, arrival information may be obtained for each of the set of nearby anchors. At step 1945, a location of the transmitter may be determined based on the arrival information for each of the set of nearby anchors.

Figure 20:
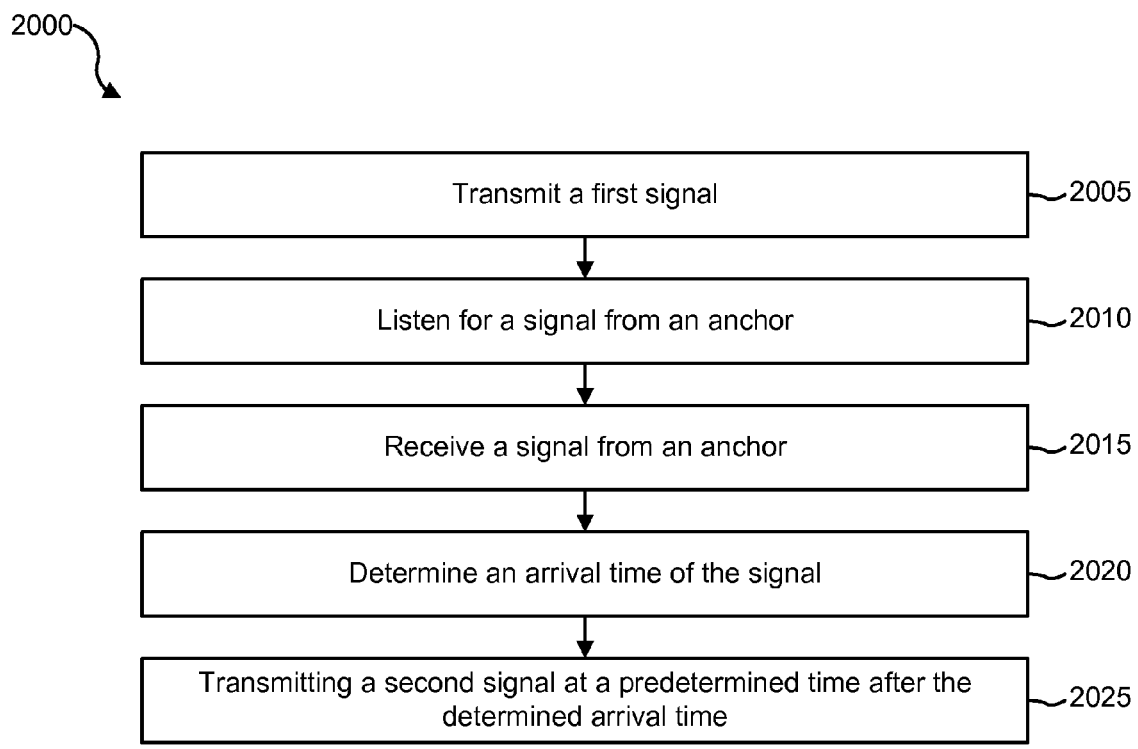
FIG. 20 is a flow diagram illustrating one example of a method for locating an object using TOA.

FIG. 20 is a flow diagram illustrating one example of a method 2000 for locating an object using TOA. The method 2000 may be implemented by the transmitting module 140 illustrated in FIGS. 1 or 10.

At block 2005, a first signal, may be transmitted. In one example, the first signal may indicate a listening period. At block 2010, the tag may listen for a signal from an anchor. In one example, the tag may listen for a signal from an anchor at a predetermined time after transmitting the first signal. At block 2015, a signal from an anchor may be received. At block 2020, an arrival time of the signal may be determined. At block 2025, a second signal may be transmitted at a predetermined time after the determined arrival time.

Figure 21:
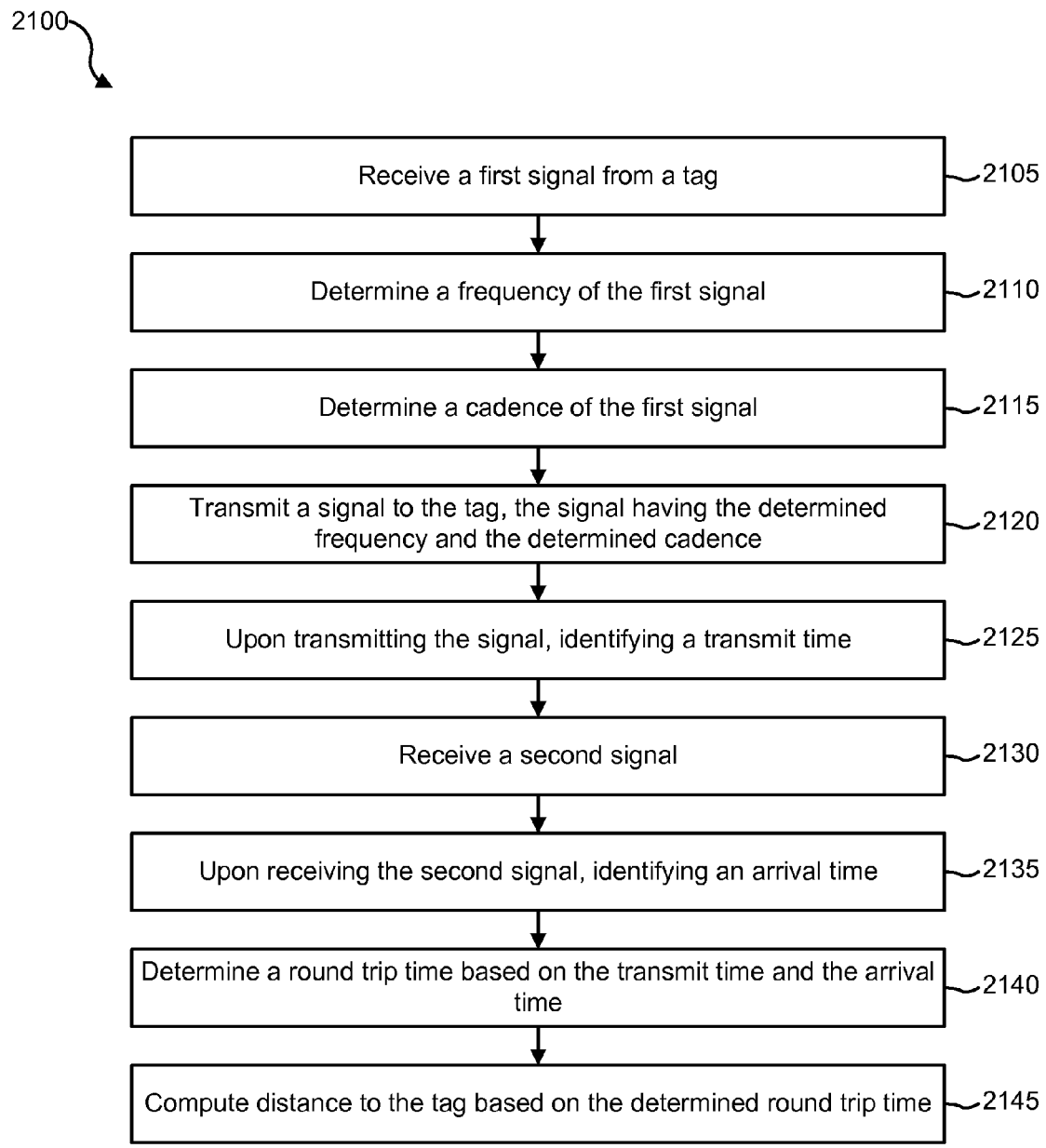
FIG. 21 is a flow diagram illustrating one example of a method for locating an object using TOA.

FIG. 21 is a flow diagram illustrating one example of a method 2100 for locating an object using TOA. The method 2100 may be implemented by the locating module 110 illustrated in FIGS. 1, 8, or 10.

At block 2105, first signal may be received from a tag. At block 2110, a frequency of the first signal may be determined. At block 2115, a cadence of the first signal may be determined. At block 2120, a signal may be transmitted to the tag. The signal may have the determined frequency and the determined cadence. Upon transmitting the signal, at block 2125, a transmit time may be identified. At block 2130, a second signal may be received. Upon receiving the second signal, at block 2135, an arrival time may be identified. At block 2140, a round trip time may be determined based on the transmit time and the arrival time. At 2145, distance to the tag may be computed based on the determined round trip time.

Figure 22:
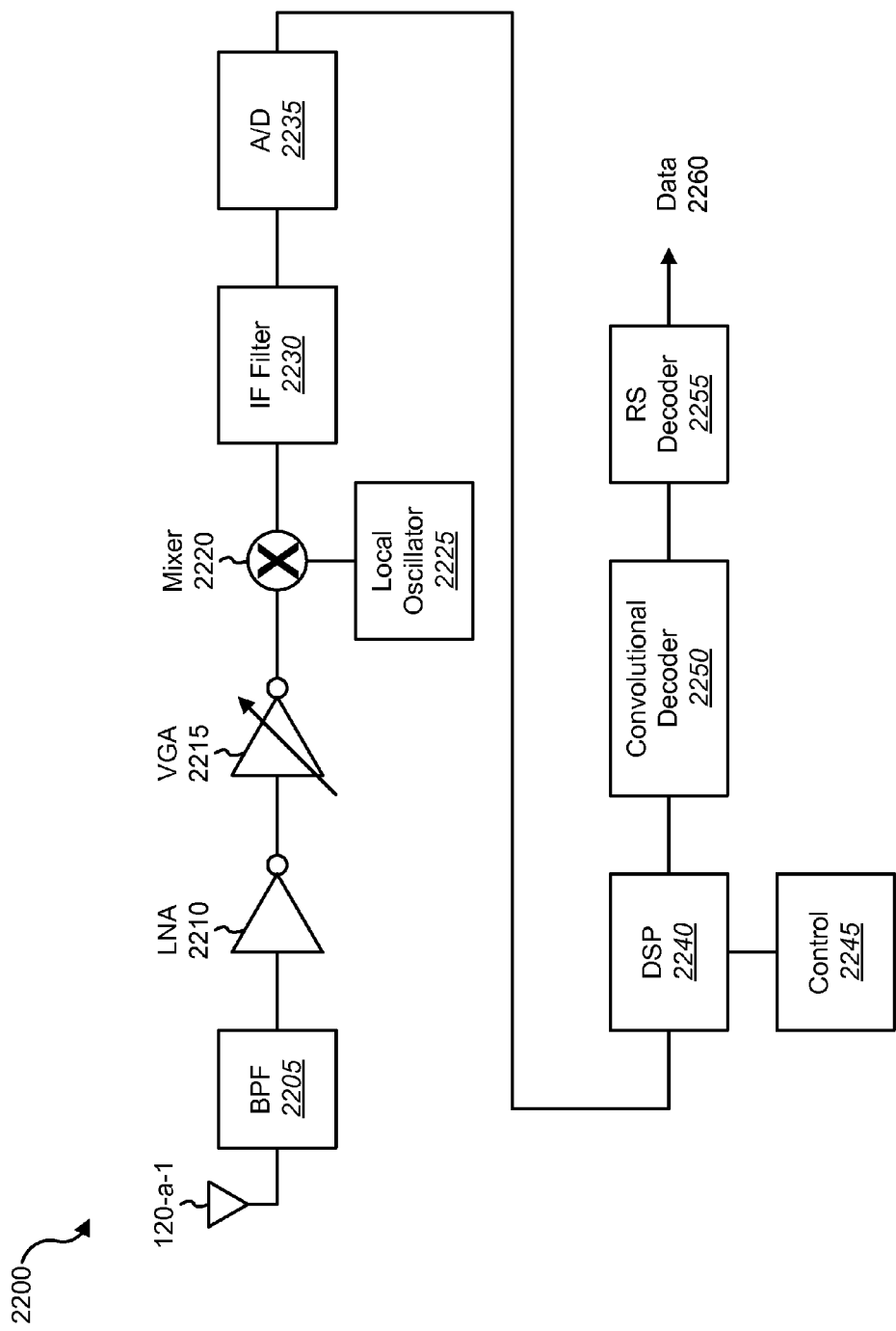
FIG. 22 is a block diagram of one example of receiving logic within an anchor and/or within a tag.
Figure 23:
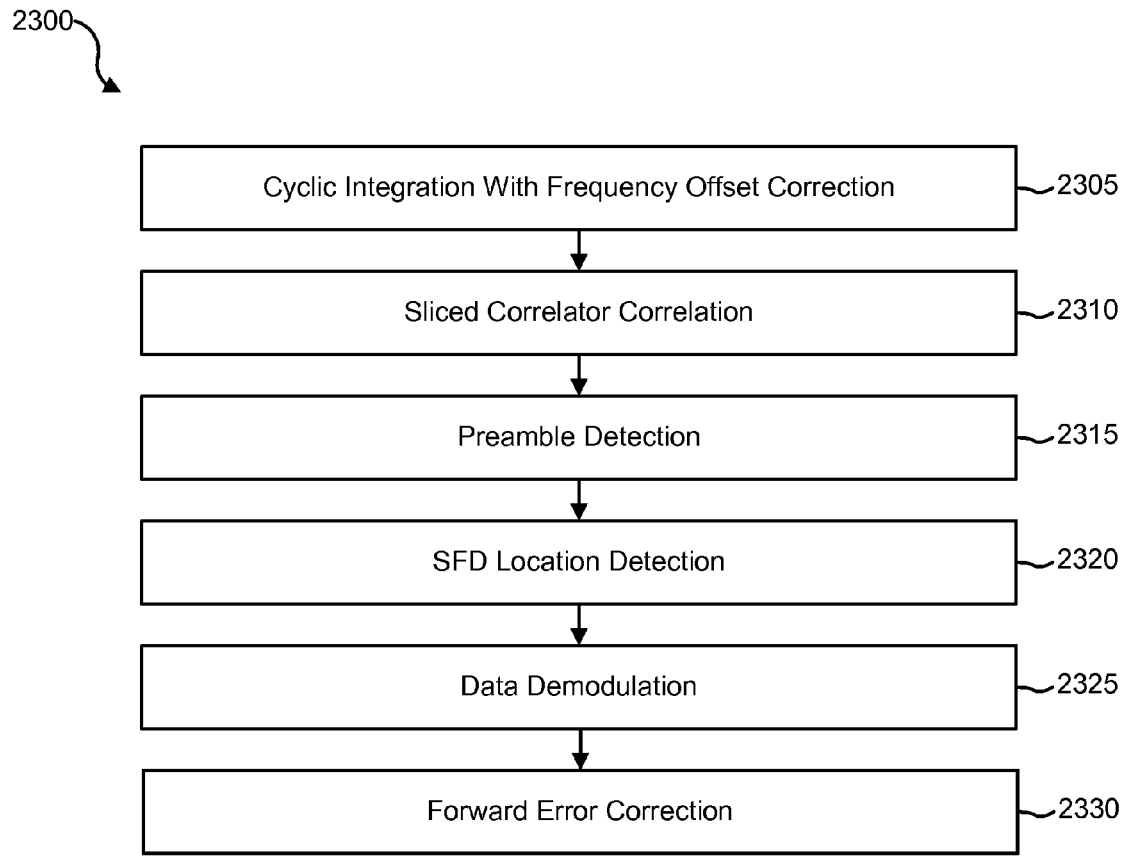
FIG. 23 is a flow diagram illustrating one example of a method for digitally processing a received signal.
Figure 24:
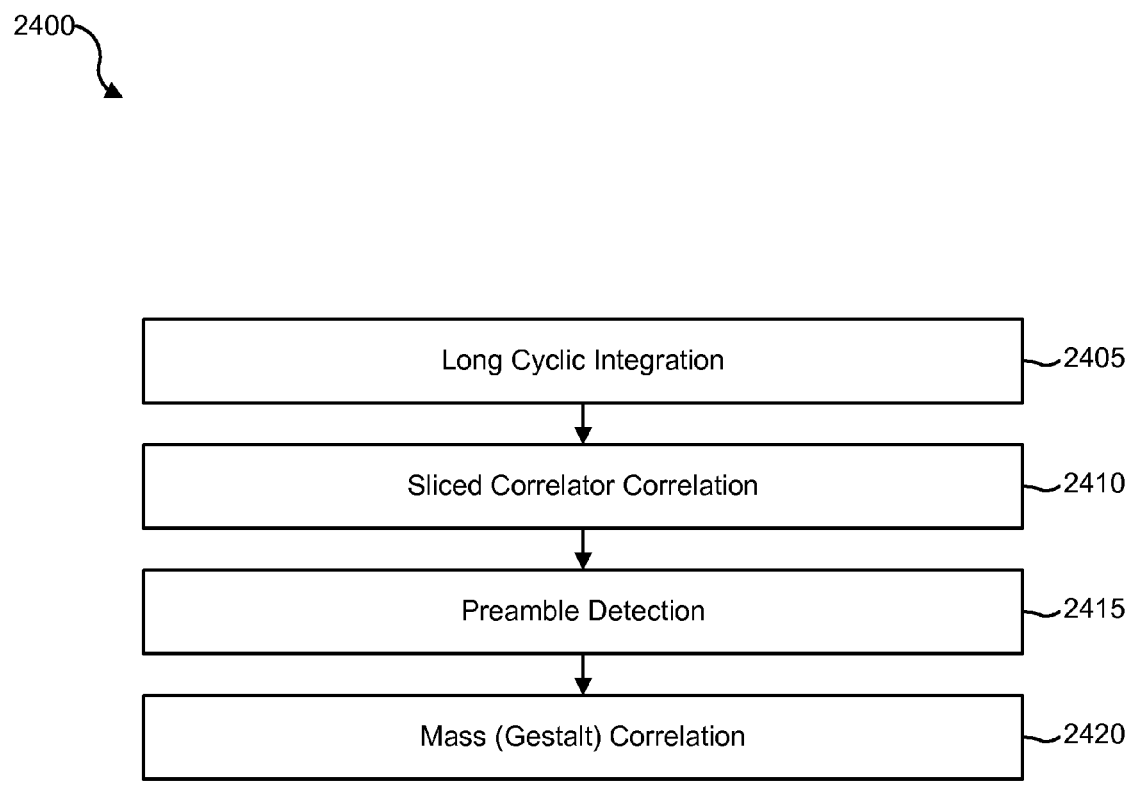
FIG. 24 is a flow diagram illustrating one example of a method for digitally processing a received signal.

FIG. 22 is a block diagram of one example of receiving logic 2200 within an anchor and/or within a tag. In some cases, the receiving logic 2200 may also be in the tag. A signal may be received by the antenna 120-a-1. The received signal may be filtered via band pass filter 2205. The filtered signal may then be amplified via low noise amplifier 2210. In some cases, the amplified signal may additionally amplified using a variable gain amplifier 2215. The filtered, amplified signal may be mixed with a particular frequency from local oscillator 2225 via mixer 1820. In one example, the local oscillator may be a variable local oscillator. For instance, it may be variable to accommodate receiving transmissions using high data rates and transmission using low data rates. The signal may then be stepped down (from 6.5 GHz, for example) to an intermediate frequency via intermediate frequency filter 2230. The filtered signal may be digitized via analog to digital converter 2235. Signal processing may be performed on the digital signal via the digital signal processor (DSP) 2240. FIGS. 23 and 24 illustrate examples of steps that may be associated with the DSP 2240. The DSP 2240 may be controlled via control 2245. The processed digital signal may be decoded using a convolution decoder 2250 and/or a Reed Solomon decoder 2255. The result of the decoding step may be data 2260.

FIG. 23 is a flow diagram illustrating one example of a method 2300 for digitally processing a received signal. The method 2300 may be implemented by the digital signal processor 2240 illustrated in FIG. 22.

At block 2305, cyclic integration with frequency offset correction may be performed. At block 2310 correlation using a sliced correlator (as described previously) may be performed. At block 2315, preamble detection may be performed. At block 2320, the start frame delimiter (SFD) location may be determined. At block 2325, data demodulation may be performed. For example, the content of the message (e.g., data 606) may be determined based on the demodulated data. At block 2330, forward error correction may be performed.

FIG. 24 is a flow diagram illustrating one example of a method 2400 for digitally processing a received signal. The method 2400 may be implemented by the digital signal processor 2240 illustrated in FIG. 22.

At block 2404, the signal may be integrated using long cyclic integration. At block 2410, the cyclically integrated signal may be correlated using a sliced correlator. As discussed above, the sliced correlator may take slices across frequency bins. At block 2415, the preamble may be detected based at least in part on the long cyclic integration. In one example, an anchor (e.g., secondary anchors) would be given the approximate expected time of arrival, the precise frequency, and the message content of an anticipated tag transmission (e.g., data sequence, data pattern, metabits). Those anchors may set their synthesizers to match the expected frequency, and may make provision for the signal chipping rate of the anticipated transmission. Those anchors may then, at the roughly correct moment(within a few microseconds, for example) commence on-frequency coherent cyclic integration of the expected UWB signal. With a 1 millisecond preamble, it may be reasonable to be able to process at least 900 microseconds. This may provide a 30 db sensitivity enhancement with respect to single symbol coherent receivers.

At block 2420, the transmission (e.g., the data portion of the signal, data 606) may be mass correlated (e.g., Gestalt correlation). Continuing with the example above, at the conclusion of the preamble detection, the anchors may have the fine timing of the tag transmission, but may not have confirmation of the tag identity, or the ability to determine which preamble symbol was the first or the last. The SFD signal may be woefully inadequate in cases where the 1000× integration may be needed, so the SFD may be ignored. In Gestalt correlation the entire message sequence (e.g., data 606) may be efficiently correlated against a stored reference pattern which was provided as the expected data (e.g., the one or more data sequences). If, for example, the data signal from the tag lasts for 2 milliseconds, the energy in the data portion of the signal may be double the preamble energy. This means that overall data pattern correlation may be at least as reliable as the preamble pattern correlation.

It may be noted that in gestalt correlation the data may not be recovered. Rather, gestalt correlation may confirm the presence of the data (so that a time of arrival may be determined, for example). Thus, the Shannon limit isn't broken, since the gestalt correlation may be making a 1 bit yes or no detection estimate rather than a 200 bit or so signal demodulation and detection. In one example, this may provide an additional 20 dB (roughly) over anchor receivers that recover data.

One of the benefits of gestalt correlation may be that the correlation shows up at only one time point (over the entire data portion) rather than being cyclic as is the case with integrated preamble correlation. As a result, the gestalt correlation may allow distant anchors to capture the time of arrival from distant tags or tags with highly attenuated paths, without multiple 1 microsecond ambiguities.

It may be noted that if only the frequency and the expected timing to within a few microseconds only were known, the correlation may not be performed, since, without knowing the modular alignment of the preambles, the correlator may face the almost insuperable problem of correlating a pattern with unknown alignment and 1 n sec time samples spanning 2 milliseconds. In such a scenario, there may be a few thousand alignments to correlate, rather than a few alignments. The few thousand alignments may require complete signal capture with post processing, and the order of 3000*256*200 complex accumulations in a short period. In one example, the proposed procedure (which determines the modular timing based on the preamble correlation) is computationally 1000 times easier, and doesn't require complete signal capture and post processing.

Thus, the staged preamble correlation followed by the gestalt correlation may be beneficial. With a few possible modular alignments, differing by a preamble symbol time from each other, the gestalt correlation process may involve about 3*256*200 complex accumulations done "on the fly". The overall computation rate may be modest, being about 6*256*200 simple additions in 2 milliseconds. This may only be about 150 million additions per second.

In some configurations, a nearby anchor may acquire the necessary data. This may give approximate timing (+− distance TOF) to be provided to other anchors. The device may distribute this information and the expected message content to those anchors. The anchors may use the frequency/time information to acquire fine preamble modular timing. Finally, that information may be used to reduce the timing possibilities to a very few so that a complete and optimal pattern correlation may be achieved.

It may be noted that the gestalt correlation may allow an optimal pattern detector to function without the ridiculous computation and storage required otherwise. Additionally, the gestalt correlation may re-encode, at a much lower data rate, a few bits of information, by having the tag send one of a few distinct encrypted messages (corresponding to the data patterns, data sequences, for example). In one example, two message possibilities may allow one data bit to be sent without materially reducing the detection sensitivity or location (via TOA, for example) accuracy. In another example, four diverse encrypted messages may similarly allow two message bits to be sent. In one example, this transmission may be the second tag transmission in the sequence.

It may also be noted that in one embodiment, the systems and methods described herein may use an all-encrypted network, which may hide data content completely. The gestalt correlation method may support message encryption (e.g., encryption of the data 606).

Figure 25:
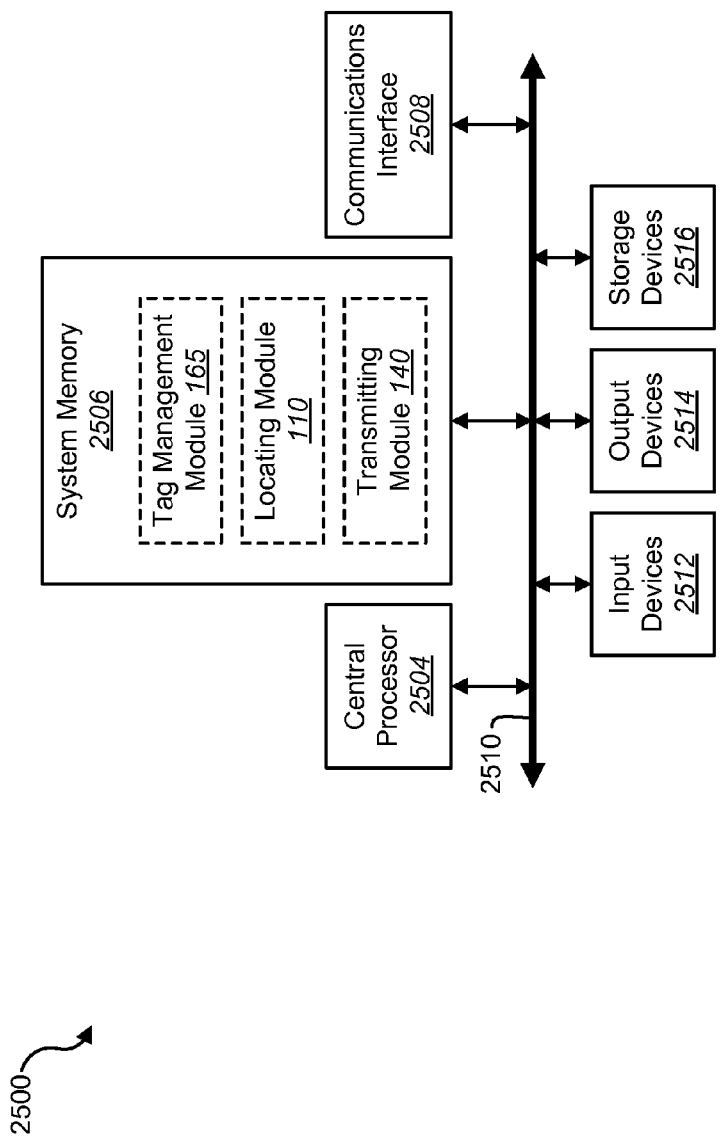
FIG. 25 depicts a block diagram of an electronic device suitable for implementing the present systems and methods.

FIG. 25 depicts a block diagram of an electronic device 2500 suitable for implementing the present systems and methods. For instance, the anchor 105, the tag 130, and/or the device 160 may each include some or all of the components of the electronic device 2500 and/or may each be an example of the electronic device 2500. The electronic device 2500 includes a bus 2510 which interconnects major subsystems of computer system 2500, such as a central processor 2504, a system memory 2506 (typically RAM, but which may also include ROM, flash RAM, or the like), a communications interface 2508, input devices 2512, output device 2514, and storage devices 2516 (hard disk, floppy disk, optical disk, etc.).

Bus 2510 allows data communication between central processor 2504 and system memory 2506, which may include read-only memory (ROM) or flash memory (neither shown), and random access memory (RAM) (not shown), as previously noted. The RAM is generally the main memory into which the operating system and application programs are loaded. The ROM or flash memory can contain, among other code, the Basic Input-Output system (BIOS) which controls basic hardware operation such as the interaction with peripheral components or devices. For example, the tag management module 165, locating module 110, and/or transmitting module 140 to implement the present systems and methods may be stored within the system memory 2506. The tag management module 165 may be an example of the tag management module 165 illustrated in FIGS. 1, 2, or 10. The locating module 110 may be an example of the locating module 110 illustrated in FIGS. 1, 8, and 10. The transmitting module 140 may be one example of the transmitting module 140 illustrated in FIGS. 1 or 10. Applications and/or algorithms resident with the electronic device 2500 are generally stored on and accessed via a non-transitory computer readable medium (stored in the system memory 2506, for example), such as a hard disk drive, an optical drive, a floppy disk unit, or other storage medium. Additionally, applications can be in the form of electronic signals modulated in accordance with the application and data communication technology when accessed via the communications interface 2508

Communications interface 2508 may provide a direct connection to a remote server or to the Internet via an internet service provider (ISP). Communications interface 2508 may provide a direct connection to a remote server via a direct network link to the Internet via a POP (point of presence). Communications interface 2508 may provide such connection using wireless techniques, including digital cellular telephone connection, Cellular Digital Packet Data (CDPD) connection, digital satellite data connection, or the like.

Many other devices or subsystems (not shown) may be connected in a similar manner. Conversely, all of the devices shown in FIG. 25 need not be present to practice the present systems and methods. The devices and subsystems can be interconnected in different ways from that shown in FIG. 10. The operation of an electronic device such as that shown in FIG. 25 is readily known in the art and is not discussed in detail in this application. Code to implement the present disclosure can be stored in a non-transitory computer-readable medium such as one or more of system memory 2506 and the storage devices 2516.

Moreover, regarding the signals described herein, those skilled in the art will recognize that a signal can be directly transmitted from a first block to a second block, or a signal can be modified (e.g., amplified, attenuated, delayed, latched, buffered, inverted, filtered, or otherwise modified) between the blocks. Although the signals of the above-described embodiment are characterized as transmitted from one block to the next, other embodiments of the present systems and methods may include modified signals in place of such directly transmitted signals as long as the informational and/or functional aspect of the signal is transmitted between blocks. To some extent, a signal input at a second block can be conceptualized as a second signal derived from a first signal output from a first block due to physical limitations of the circuitry involved (e.g., there will inevitably be some attenuation and delay). Therefore, as used herein, a second signal derived from a first signal includes the first signal or any modifications to the first signal, whether due to circuit limitations or due to passage through other circuit elements which do not change the informational and/or final functional aspect of the first signal.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

Furthermore, while various embodiments have been described and/or illustrated herein in the context of fully functional electronic devices, one or more of these exemplary embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in an electronic device. In some embodiments, these software modules may configure an electronic device to perform one or more of the exemplary embodiments disclosed herein.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present systems and methods and their practical applications, to thereby enable others skilled in the art to best utilize the present systems and methods and various embodiments with various modifications as may be suited to the particular use contemplated.

Unless otherwise noted, the terms "a" or "an," as used in the specification and claims, are to be construed as meaning "at least one of." In addition, for ease of use, the words "including" and "having," as used in the specification and claims, are interchangeable with and have the same meaning as the word "comprising."

What is claimed is:

1. A computer implemented method to locate an object, comprising:
    receiving, by an anchor, a first transmission from a tag, the first transmission initiated by the tag;
    determining, by a processor of the anchor, a particular frequency of the first transmission;
    determining, by the processor, a particular time for a second transmission from the tag based at least in part on a receipt time of the first transmission and a transmission schedule for the tag;

determining, by the processor, tuning information for tuning into the second transmission from the tag at the particular time and at the particular frequency; and sending, by the processor, the tuning information to a disparate device.

2. The method of claim 1, further comprising:
demodulating a data portion of the first transmission;
determining a data sequence based on the demodulated data portion; and
sending the data sequence to the disparate device.

3. The method of claim 1, further comprising:
receiving the second transmission from the tag.

4. The method of claim 3 further comprising:
determining an arrival time for the received second transmission.

5. The method of claim 4, further comprising:
sending the arrival time to the disparate device.

6. The method of claim 1, further comprising:
receiving an instruction from the disparate device to send a message to the tag.

7. The method of claim 1, further comprising:
sending a message to the tag at a first time, wherein the first time corresponds to a listening mode of the tag.

8. The method of claim 7, wherein the message is transmitted to the tag based at least in part on the particular frequency of the first transmission.

9. The method of claim 7, wherein:
the message is transmitted at a higher data rate than the first transmission.

10. The method of claim 9, wherein:
the message is transmitted over a shortened portion of a time period;
the message is transmitted at a transmit power above a threshold over the shortened portion; and
the average power over the time period does not exceed the threshold.

11. The method of claim 7, wherein the message comprises instructions for the tag to transmit a transmission having a plurality of preambles.

12. The method of claim 7, wherein the message comprises instructions for management of the tag.

13. The method of claim 7, wherein the message comprises instructions for the tag to transmit an additional transmission at a predetermined time after receiving the message.

14. The method of claim 13, further comprising:
receiving the additional transmission from the tag at a second time; and
determining an elapsed time based on the first time and the second time.

15. The method of claim 14, further comprising:
determining a round trip time based at least in part on the elapsed time and the predetermined time.

16. A computer-program product to locate an object, the computer-program product comprising a non-transitory computer-readable medium having instructions thereon, the instructions being executable by a processor to:
receive, by an anchor, a first transmission from a tag, the first transmission initiated by the tag;
determine a particular frequency of the first transmission;
determine a particular time for a second transmission from the tag based at least in part on a receipt time of the first transmission and a transmission schedule for the tag;
determine tuning information for tuning into the second transmission from the tag at the particular time and at the particular frequency; and
send the tuning information to a disparate device.

17. A computer implemented method to locate an object, comprising:
receiving, from a first receiver of a plurality of receivers, tuning information for tuning into a second transmission from a tag at a particular time and at a particular frequency, the tuning information determined based on a receive time and the particular frequency of a first transmission of the tag and a transmission schedule for the tag, wherein the first transmission is initiated by the tag;
identifying, by a processor, a set of receivers from the plurality of receivers, based at least in part on a location of the first receiver and a respective location of each of the plurality of receivers;
determining, by the processor, tuning instructions for each receiver in the set of receivers based at least in part on the received tuning information, the tuning instructions for receiving the second transmission from the tag;
sending, by the processor, the determined tuning instructions to each respective receiver in the set of receivers;
receiving arrival information for the second transmission from the tag from each receiver in the set of receivers that detected the second transmission, the second transmission detected based at least in part on the tuning instructions;
selecting one receiver from the set of receivers as a synchronizing receiver based on one or more signal quality measurements from the set of receivers; and
instructing the synchronizing receiver to send a message to the tag.

18. The method of claim 17, wherein the tuning information comprises one or more of frequency information, timing information, and a data sequence.

19. The method of claim 18, further comprising:
instructing a receiver from the set of receivers to correlate a data portion of a transmission based on the data sequence.

* * * * *